United States Patent
Adib et al.

(10) Patent No.: US 10,822,271 B2
(45) Date of Patent: Nov. 3, 2020

(54) GLASS, GLASS-CERAMIC AND CERAMIC ARTICLES WITH DURABLE LUBRICIOUS ANTI-FINGERPRINT COATINGS OVER OPTICAL AND SCRATCH-RESISTANT COATINGS AND METHODS OF MAKING THE SAME

(71) Applicants: CORNING INCORPORATED, Corning, NY (US); CORNING PRECISION MATERIALS CO., LTD., Asan-si (KR)

(72) Inventors: Kaveh Adib, Corning, NY (US); Robert Alan Bellman, Painted Post, NY (US); Yuhui Jin, Painted Post, NY (US); Benedict Yorke Johnson, Horseheads, NY (US); Timothy Edward Myers, Painted Post, NY (US); Eric Louis Null, Corning, NY (US); Jung-keun Oh, Gwangmyeong-si (KR); Charles Andrew Paulson, Painted Post, NY (US); James Joseph Price, Corning, NY (US); Florence Christine Monique Verrier, Corning, NY (US); Jin-ah Yoo, Hwaseong-si (KR)

(73) Assignee: Corning Incorporated, Corning, NY (US)

( * ) Notice: Subject to any disclaimer, the term of this patent is extended or adjusted under 35 U.S.C. 154(b) by 262 days.

(21) Appl. No.: 15/974,188

(22) Filed: May 8, 2018

(65) Prior Publication Data
US 2018/0319704 A1    Nov. 8, 2018

Related U.S. Application Data

(60) Provisional application No. 62/502,911, filed on May 8, 2017.

(51) Int. Cl.
*C03C 17/42* (2006.01)
*C04B 41/52* (2006.01)
(Continued)

(52) U.S. Cl.
CPC ............ *C03C 17/42* (2013.01); *C03C 17/002* (2013.01); *C04B 41/009* (2013.01); *C04B 41/52* (2013.01);
(Continued)

(58) Field of Classification Search
CPC .............. C03C 17/42; C03C 2217/281; C03C 2217/76; C03C 2217/78
See application file for complete search history.

(56) References Cited

U.S. PATENT DOCUMENTS

| | | | |
|---|---|---|---|
| 6,743,516 B2 | 6/2004 | Murphy et al. | |
| 8,822,018 B2 | 9/2014 | Thoumazet et al. | |

(Continued)

FOREIGN PATENT DOCUMENTS

| | | |
|---|---|---|
| EP | 996410 B1 | 10/2001 |
| FR | 2982607 A1 | 5/2013 |

(Continued)

OTHER PUBLICATIONS

Charles Kittel, "Introduction to Solid State Physics." Seventh Edition, John Wiley & Sons, Inc., NY, 1996, pp. 611-627.
(Continued)

*Primary Examiner* — Ramsey Zacharia

(57) ABSTRACT

An article that includes: a glass, glass-ceramic or ceramic substrate comprising a primary surface; at least one of an optical film and a scratch-resistant film disposed over the primary surface; and an easy-to-clean (ETC) coating comprising a fluorinated material that is disposed over an outer surface of the at least one of an optical film and a scratch-resistant film. The at least one of an optical film and a
(Continued)

scratch-resistant film comprises an average hardness of 12 GPa or more. Further, the outer surface of the at least one of an optical film and a scratch-resistant film comprises a surface roughness ($R_q$) of less than 1.0 nm. Further, the at least one of an optical film and a scratch-resistant film comprises a total thickness of about 500 nm or more.

24 Claims, 8 Drawing Sheets

(51) Int. Cl.
  *C04B 41/89* (2006.01)
  *H05K 5/03* (2006.01)
  *H05K 5/00* (2006.01)
  *C04B 41/00* (2006.01)
  *C03C 17/00* (2006.01)

(52) U.S. Cl.
  CPC ........... *C04B 41/89* (2013.01); *H05K 5/0017* (2013.01); *H05K 5/03* (2013.01); *C03C 2217/281* (2013.01); *C03C 2217/75* (2013.01); *C03C 2217/76* (2013.01); *C03C 2217/77* (2013.01); *C03C 2217/78* (2013.01); *C03C 2218/154* (2013.01)

(56) References Cited

U.S. PATENT DOCUMENTS

2008/0241523 A1   10/2008   Huignard et al.
2017/0183257 A1*   6/2017   Apitz ..................... C03C 3/097

FOREIGN PATENT DOCUMENTS

WO   2013085795 A1   6/2013
WO   2015125498 A1   8/2015

OTHER PUBLICATIONS

Fischer-Cripps; "Critical Review of Analysis and Interpretation of Nanoindentation Test Date"; Surface & Coatings Technology, 200, 4153-4165 (2006).
Hay et al; "Continuous Stiffness Measurement During Instrumented Indentation Testing"; Experimental Techniques, 34 (3) 86-94 (2010).
International Search Report and Written Opinion of the International Searching Authority; PCT/US2018/031569; dated Jul. 17, 2018; 12 Pages; European Patent Office.
James F. Shackelford, "Introduction to Materials Science for Engineers,"Sixth Edition, Pearson Prentice Hall, New Jersey, 2005, pp. 404-418.
Smart and Moore; "Solid State Chemistry, An Introduction," Chapman & Hall University and Professional Division, London, 1992, pp. 136-151.

\* cited by examiner

GLASS, GLASS-CERAMIC AND CERAMIC ARTICLES WITH DURABLE LUBRICIOUS ANTI-FINGERPRINT COATINGS OVER OPTICAL AND SCRATCH-RESISTANT COATINGS AND METHODS OF MAKING THE SAME

CROSS-REFERENCE TO RELATED APPLICATION

This application claims the benefit of priority under 35 U.S.C. § 119 of U.S. Provisional Application Ser. No. 62/502,911 filed on May 8, 2017, the content of which is relied upon and incorporated herein by reference in its entirety.

FIELD

The present disclosure generally relates to glass, glass-ceramic and ceramic articles with durable lubricious coatings over optical coatings and/or scratch-resistant coatings, along with methods of making the same.

BACKGROUND

Glass, glass-ceramic and ceramic materials, many of which are configured or otherwise processed with various strength-enhancing features, are prevalent in various displays and display devices of many consumer electronic products. For example, chemically strengthened glass is favored for many touch-screen products, including cell phones, music players, e-book readers, notepads, tablets, laptop computers, automatic teller machines, and other similar devices. Many of these glass, glass-ceramic and ceramic materials are also employed in displays and display devices of consumer electronic products that do not have touch-screen capability, but are prone to direct human contact, including desktop computers, laptop computers, elevator screens, equipment displays, and others.

These glass, glass-ceramic and ceramic materials, however, are often subject to human contact that can result in surface contamination, visible fingerprints, staining, and other foreign substances that can affect optical clarity of the displays and display devices employing these materials. In addition, these displays and display devices frequently employ optical coatings, such as anti-reflective (AR) coatings that are particularly prone to surface contamination, stains and the like from direct human contact. Further, these unwanted foreign substances can negatively affect the aesthetics of the products employing these displays and display devices. In addition, these reductions in optical clarity can cause a user to increase the brightness of the display device, leading to increased battery usage and less time between charging evolutions.

In view of these considerations and drawbacks associated with glass, glass-ceramic and ceramic material surfaces, many consumer electronic products employing these materials also feature an easy-to-clean (ETC) coating over any surfaces of the glass, glass-ceramic and ceramic substrates exposed to human contact and any other optical coatings, if present. Many of these ETC coatings contain one or more fluorinated materials. These ETC coatings are generally hydrophobic and oleophobic in nature, and can also be referred to as "anti-fingerprint," "lubricious" or "anti-smudge" coatings. Among the benefits offered by ETC coatings is an added degree of ease in removing fingerprints, stains and other surface contamination from these glass, glass-ceramic and ceramic materials. ETC coatings, given their hydrophobic and oleophobic nature, are also less likely to retain or be prone to surface contamination from human contact in the first instance.

While ETC coatings offer many benefits to electronic products employing glass, glass-ceramic and ceramic materials in their displays and display devices, the coatings themselves can be sensitive to wear. For example, wear associated with these coatings can negatively affect their hydrophobicity and/or oleophobicity, which can reduce the ability of the coating to perform as intended. In addition, the wear associated with these ETC coatings can be exacerbated by the presence of an optical coating and/or scratch-resistant coating between the ETC coating and the glass, glass-ceramic or ceramic materials, as these intervening coatings can have increased roughness relative to the outer surface of the glass, glass-ceramic or ceramic material itself.

Efforts to improve the durability of these ETC coatings have involved adjusting the composition of the coatings and processing conditions (e.g., curing conditions) with limited degrees of success. Efforts to increase the thickness of these ETC coatings to enhance long-term durability also have had little success, as such efforts often come at the expense of reduced optical properties of the articles employing the ETC coatings, increased manufacturing cost and increased process control variability of the coating deposition.

In view of these considerations, there is a need for glass, glass-ceramic and ceramic articles, particularly those employing scratch-resistant and optical films, with lubricious ETC coatings having high durability, along with methods of making the same.

SUMMARY

An aspect of this disclosure pertains to an article that includes: a glass, glass-ceramic or ceramic substrate comprising a primary surface; at least one of an optical film and a scratch-resistant film disposed over the primary surface; and an easy-to-clean (ETC) coating comprising a fluorinated material that is disposed over an outer surface of the at least one of an optical film and a scratch-resistant film. The at least one of an optical film and a scratch-resistant film comprises an average hardness of 12 GPa or more. Further, the outer surface of the at least one of an optical film and a scratch-resistant film comprises a surface roughness ($R_q$) of less than 1.0 nm. In other aspects of the disclosure, the at least one of an optical film and a scratch-resistant film can comprise a total thickness of about 500 nm or more. According to some implementations, the at least one of an optical film and a scratch-resistant film can comprise a total thickness of about 1500 nm or more.

A further aspect of this disclosure pertains to an article that includes: a glass, glass-ceramic or ceramic substrate comprising a primary surface; at least one of an optical film and a scratch-resistant film disposed over the primary surface; and an easy-to-clean (ETC) coating comprising a fluorinated material that is disposed over an outer surface of the at least one of an optical film and a scratch-resistant film. The at least one of an optical film and a scratch-resistant film comprises a total thickness of about 500 nm or more. Further, the outer surface of the at least one of an optical film and a scratch-resistant film comprises a surface roughness ($R_q$) of less than 1.0 nm. According to some implementations, the at least one of an optical film and a scratch-resistant film can comprise a total thickness of about 1500 nm or more.

In embodiments of these aspects, the outer surface of the at least one of an optical film and a scratch-resistant film comprises a surface roughness ($R_q$) of less than 0.7 nm. In other embodiments, the outer surface of the at least one of an optical film and a scratch-resistant film comprises a surface roughness ($R_q$) of less than 0.5 nm.

According to some implementations of these aspects, the exposed surface of the ETC coating comprises an average contact angle with water of 100 degrees or more after being subjected to 2000 reciprocating cycles under a load of 1 kg, according to a Steel Wool Test. In other implementations, the exposed surface of the ETC coating comprises an average contact angle with water of 100 degrees or more after being subjected to 3500 reciprocating cycles under a load of 1 kg, according to the Steel Wool Test. In aspects of the disclosure, including these implementations, the ETC coating of the article comprises a perfluoropolyether (PFPE) silane.

In further implementations of these aspects, the at least one of an optical film and a scratch-resistant film can comprise a scratch-resistant film comprising an $AlO_xN_y$ material. In other aspects of the disclosure the at least one of an optical film and a scratch-resistant film comprises a scratch-resistant film that comprises a $Si_uAl_xO_yN_z$ material. In some implementations of these articles, the article further comprises an optical film and the scratch-resistant film is disposed over the optical film. In some embodiments of these articles the substrate comprises a glass composition and a compressive stress region, the compressive stress region extending from the primary surface to a first selected depth in the substrate.

In an additional implementation of these aspects, a consumer electronic device is provided that includes: a housing a having a front surfaced, a back surface and side surfaces; electrical components provided at least partially within the housing, the electrical components including at least a controller, a memory, and a display, the display being provided at or adjacent to the front surface of the housing; and a cover glass disposed over the display. Further, at least one of a portion of the housing or the cover glass comprises the article of any one of the foregoing articles.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure and the appended claims.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following embodiments.

According to a first aspect, an article is provided that includes: a glass, glass-ceramic or ceramic substrate comprising a primary surface; at least one of an optical film and a scratch-resistant film disposed over the primary surface; and an easy-to-clean (ETC) coating comprising a fluorinated material that is disposed over an outer surface of the at least one of an optical film and a scratch-resistant film. The at least one of an optical film and a scratch-resistant film comprises an average hardness of 12 GPa or more. Further, the outer surface of the at least one of an optical film and a scratch-resistant film comprises a surface roughness ($R_q$) of less than 1.0 nm.

According to a second aspect, the article of aspect 1 is provided, wherein the outer surface of the at least one of an optical film and a scratch-resistant film comprises a surface roughness ($R_q$) of less than 0.7 nm.

According to a third aspect, the article of aspect 1 is provided, wherein the outer surface of the at least one of an optical film and a scratch-resistant film comprises a surface roughness ($R_q$) of less than 0.5 nm.

According to a fourth aspect, any one of aspects 1-3 is provided, wherein an exposed surface of the ETC coating comprises an average contact angle with water of 100 degrees or more after being subjected to 2000 reciprocating cycles under a load of 1 kg according to a Steel Wool Test.

According to a fifth aspect, any one of aspects 1-3 is provided, wherein an exposed surface of the ETC coating comprises an average contact angle with water of 100 degrees or more after being subjected to 3500 reciprocating cycles under a load of 1 kg according to a Steel Wool Test.

According to a sixth aspect, any one of aspects 1-5 is provided, wherein the ETC coating comprises a perfluoropolyether (PFPE) silane.

According to a seventh aspect, any one of aspects 1-6 is provided, wherein the at least one of an optical film and a scratch-resistant film can comprise a scratch-resistant film comprising an $AlO_xN_y$ material According to an eighth aspect, any one of aspects 1-7 is provided, wherein the at least one of an optical film and a scratch-resistant film comprises a scratch-resistant film that comprises a $Si_uAl_xO_yN_z$ material.

According to a ninth aspect, any one of aspects 1-8 is provided, wherein the at least one of an optical film and a scratch-resistant film further comprises an optical film and the scratch-resistant film is disposed over the optical film.

According to a tenth aspect, any one of aspects 1-9 is provided, wherein the substrate comprises a glass composition and a compressive stress region, the compressive stress region extending from the primary surface to a first selected depth in the substrate.

According to an eleventh aspect, any one of aspects 1-10 is provided, wherein the at least one of an optical film and a scratch-resistant film comprises a total thickness of about 500 nm or more.

According to a twelfth aspect, any one of aspects 1-11 is provided, wherein the at least one of an optical film and a scratch-resistant film comprises a total thickness of about 500 nm or more.

According to a thirteenth aspect, an article is provided that includes: a glass, glass-ceramic or ceramic substrate comprising a primary surface; at least one of an optical film and a scratch-resistant film disposed over the primary surface; and an easy-to-clean (ETC) coating comprising a fluorinated material that is disposed over an outer surface of the at least one of an optical film and a scratch-resistant film. The at least one of an optical film and a scratch-resistant film comprises a total thickness of about 500 nm or more. Further, the outer surface of the at least one of an optical film and a scratch-resistant film comprises a surface roughness ($R_q$) of less than 1.0 nm.

According to a fourteenth aspect, the article of aspect 13 is provided, wherein the outer surface of the at least one of an optical film and a scratch-resistant film comprises a surface roughness ($R_q$) of less than 0.7 nm.

According to a fifteenth aspect, the article of aspect 13 is provided, wherein the outer surface of the at least one of an optical film and a scratch-resistant film comprises a surface roughness ($R_q$) of less than 0.5 nm.

According to a sixteenth aspect, any one of aspects 13-15 is provided, wherein an exposed surface of the ETC coating comprises an average contact angle with water of 100 degrees or more after being subjected to 2000 reciprocating cycles under a load of 1 kg according to a Steel Wool Test.

According to a seventeenth aspect, any one of aspects 13-15 is provided, wherein an exposed surface of the ETC coating comprises an average contact angle with water of 100 degrees or more after being subjected to 3500 reciprocating cycles under a load of 1 kg according to a Steel Wool Test.

According to an eighteenth aspect, any one of aspects 13-17 is provided, wherein the ETC coating comprises a perfluoropolyether (PFPE) silane.

According to a nineteenth aspect, any one of aspects 13-18 is provided, wherein the at least one of an optical film and a scratch-resistant film can comprise a scratch-resistant film comprising an $AlO_xN_y$ material According to a twentieth aspect, any one of aspects 13-19 is provided, wherein the at least one of an optical film and a scratch-resistant film comprises a scratch-resistant film that comprises a $Si_uAl_xO_yN_z$ material.

According to a twenty-first aspect, any one of aspects 13-20 is provided, wherein the at least one of an optical film and a scratch-resistant film further comprises an optical film and the scratch-resistant film is disposed over the optical film.

According to a twenty-second aspect, any one of aspects 13-21 is provided, wherein the substrate comprises a glass composition and a compressive stress region, the compressive stress region extending from the primary surface to a first selected depth in the substrate.

According to a twenty-third aspect, any one of aspects 13-22 is provided, wherein the at least one of an optical film and a scratch-resistant film comprises a total thickness of about 1500 nm or more.

According to a twenty-fourth aspect, a consumer electronic product is provided that includes: a housing a having a front surfaced, a back surface and side surfaces; electrical components provided at least partially within the housing, the electrical components including at least a controller, a memory, and a display, the display being provided at or adjacent to the front surface of the housing; and a cover glass disposed over the display. Further, at least one of a portion of the housing or the cover glass comprises the article of any one of aspects 1-23.

BRIEF DESCRIPTION OF THE DRAWINGS

These and other features, aspects and advantages of the present disclosure are better understood when the following detailed description of the disclosure is read with reference to the accompanying drawings, in which.

DETAILED DESCRIPTION

Figure 1A:
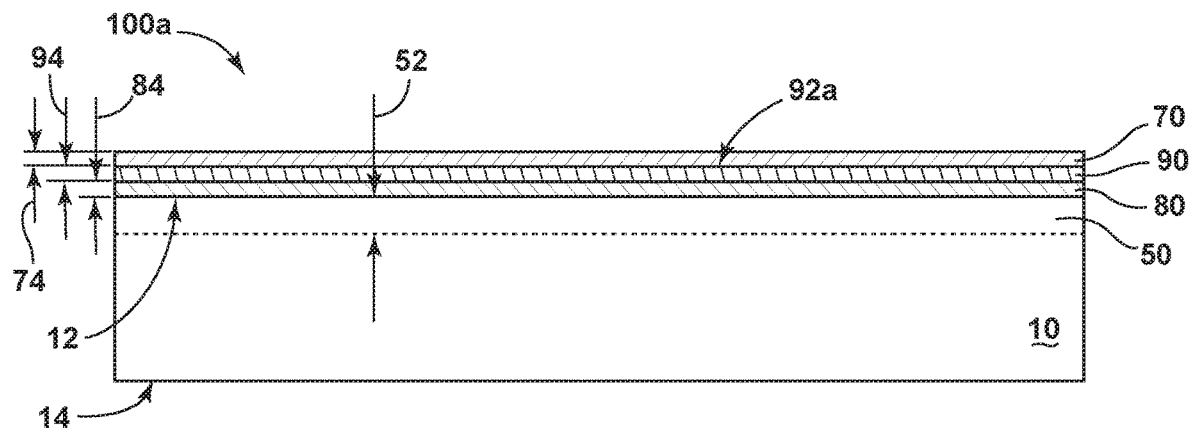
FIG. 1A is a cross-sectional, schematic view of a glass article comprising a glass substrate with an optical film, scratch-resistant film and an ETC coating disposed over the substrate, according to some aspects of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

Aspects of the disclosure generally pertain to articles having glass, glass-ceramic and ceramic substrates with lubricious, anti-fingerprint and easy-to-clean (ETC) coatings with high durability and methods of making the same. These lubricious ETC coatings are disposed on one or more intervening layers (e.g., an optical film, a scratch-resistant film, a scratch-resistant film over an optical film, etc.), which are disposed over the substrate. Further, the optical film and/or scratch-resistant film includes a very low surface roughness ($R_q$), e.g., less than 1.0 nm. In addition, the optical film and/or scratch-resistant film can comprise an average hardness of 12 GPa or more and/or a total thickness of about 500 nm or more. Without being bound by theory, reductions in the surface roughness of the film, layer or structure (e.g., the optical film and/or scratch-resistant film) residing beneath the ETC coating tend to significantly increase the durability of the ETC coating.

Referring to FIG. 1A, an article 100a is depicted that includes: a glass, glass-ceramic or ceramic substrate 10 comprising a glass, glass-ceramic or ceramic composition. That is, the substrate 10 may include one or more of glass, glass-ceramic, or ceramic materials therein. The substrate 10 comprises a pair of opposing primary surfaces 12, 14. Further, the article 100a includes an optical film 80 disposed over the primary surface 12, and a scratch-resistant film 90 disposed over the optical film 80. The article 100a further includes an easy-to-clean (ETC) coating 70 disposed over the films 80, 90. In particular, as shown in FIG. 1A, the ETC coating 70 is located on the outer surface 92a of the scratch-resistant film 90. Also as shown in FIG. 1A, the optical film 80 has a thickness 84, the scratch-resistant film 90 has a thickness 94 and the ETC coating 70 has a thickness 74.

In some embodiments of the article 100a, the substrate 10 comprises a glass composition. The substrate 10, for example, can comprise a borosilicate glass, an aluminosilicate glass, soda-lime glass, chemically strengthened borosilicate glass, chemically strengthened aluminosilicate glass, and chemically strengthened soda-lime glass. The substrate may have a selected length and width, or diameter, to define its surface area. The substrate may have at least one edge between the primary surfaces 12, 14 of the substrate 10 defined by its length and width, or diameter. The substrate 10 may also have a selected thickness. In some embodiments, the substrate has a thickness of from about 0.2 mm to about 1.5 mm, from about 0.2 mm to about 1.3 mm, and from about 0.2 mm to about 1.0 mm. In other embodiments, the substrate has a thickness of from about 0.1 mm to about 1.5 mm, from about 0.1 mm to about 1.3 mm, or from about 0.1 mm to about 1.0 mm.

According to some aspects of the article 100a, the substrate 10 comprises a compressive stress region 50 (see FIG. 1A) that extends from at least one of the primary surfaces 12, 14 to a selected depth 52. As used herein, a "selected depth," (e.g., selected depth 52) "depth of layer" and "DOC" are used interchangeably to define the depth at which the stress in the chemically strengthened alkali aluminosilicate glass article described herein changes from compressive to tensile. DOC may be measured by a surface stress meter, such as an FSM-6000, or a scattered light polariscope (SCALP) depending on the ion exchange treatment. Where the stress in the glass article is generated by exchanging potassium ions into the glass article, a surface stress meter is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by a surface stress meter. As also used herein, the "maximum compressive stress" is defined as the maximum compressive stress within the compressive stress region 50 in the substrate 10. In some embodiments, the maximum compressive stress is obtained at or in close proximity to the one or more primary surfaces 12, 14 defining the compressive stress region 50. In other embodiments, the maximum compressive stress is obtained between the one or more primary surfaces 12, 14 and the selected depth 52 of the compressive stress region 50.

In some implementations of the article 100a, as depicted in exemplary form in FIG. 1A, the substrate 10 is selected from a chemically strengthened aluminosilicate glass. In other embodiments, the substrate 10 is selected from chemically strengthened aluminosilicate glass having a compressive stress region 50 extending to a first selected depth 52 of greater than 10 µm, with a maximum compressive stress of greater than 150 MPa. In further embodiments, the substrate 10 is selected from a chemically strengthened aluminosilicate glass having a compressive stress region 50 extending to a first selected depth 52 of greater than 25 µm, with a maximum compressive stress of greater than 400 MPa. The substrate 10 of the article 100a may also include one or more compressive stress regions 50 that extend from one or more of the primary surfaces 12, 14 to a selected depth 52 (or depths) having a maximum compressive stress of greater than about 150 MPa, greater than 200 MPa, greater than 250 MPa, greater than 300 MPa, greater than 350 MPa, greater than 400 MPa, greater than 450 MPa, greater than 500 MPa, greater than 550 MPa, greater than 600 MPa, greater than 650 MPa, greater than 700 MPa, greater than 750 MPa, greater than 800 MPa, greater than 850 MPa, greater than 900 MPa, greater than 950 MPa, greater than 1000 MPa, and all maximum compressive stress levels between these values. In addition, the depth of compression (DOC) or first selected depth 52 can be set at 10 µm or greater, 15 µm or greater, 20 µm or greater, 25 µm or greater, 30 µm or greater, 35 µm or greater and to even higher depths depending on the thickness of the substrate 10 and the processing conditions associated with generating the compressive stress region 50. Compressive stress (including surface CS) is measured by a surface stress meter using commercially available instruments such as the FSM-6000 (i.e., an FSM), as manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

Similarly, with respect to glass-ceramics, the material chosen for the substrate 10 of the article 100a can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, or carnegieite. "Glass-ceramics" include materials produced through controlled crystallization of glass. In embodiments, glass-ceramics have about 30% to about 90% crystallinity. Examples of suitable glass-ceramics may include $Li_2O$—$Al_2O_3$—$SiO_2$ system (i.e. LAS-System) glass-ceramics, $MgO$—$Al_2O_3$—$SiO_2$ system (i.e. MAS-System) glass-ceramics, $ZnO \times Al_2O_3 \times nSiO_2$ (i.e. ZAS system), and/or glass-ceramics that include a predominant crystal phase including β-quartz solid solution, β-spodumene, cordierite, and lithium disilicate. The glass-ceramic substrates may be strengthened using the chemical strengthening processes disclosed herein. In one or more embodiments, MAS-System glass-ceramic substrates may be strengthened in $Li_2SO_4$ molten salt, whereby an exchange of $2Li^+$ for $Mg^{2+}$ can occur.

With respect to ceramics, the material chosen for the substrate 10 of the article 100a can be any of a wide range of inorganic crystalline oxides, nitrides, carbides, oxynitrides, carbonitrides, and/or the like. Illustrative ceramics include those materials having an alumina, aluminum titanate, mullite, cordierite, zircon, spinel, persovskite, zirconia, ceria, silicon carbide, silicon nitride, silicon aluminum oxynitride or zeolite phase.

As depicted in FIG. 1A, embodiments of the article 100a can include one or more of an optical film 80 and a scratch-resistant film 90 disposed over one or more primary surfaces 12, 14 of the substrate 10. As shown in FIG. 1A, one or more of the films 80, 90 are disposed between the ETC coating 70 and the primary surface 12 of the substrate 10. According to some implementations, the films 80, 90 can also be disposed over the primary surface 14 of the substrate 10. With regard to the optical film 80, it may include, for example, an anti-reflective (AR) coating, band-pass filter coatings, edge neutral mirror and beam splitter coatings, multi-layer high-reflectance coatings and edge filter coatings. It should be understood, however, that other functional films may be used to achieve a desired optical property of the resulting article 100a.

Source materials for the optical film 80 may comprise a multi-layer coating, film or structure with each layer having a different refractive index. In some embodiments, the multi-layer structure comprises one or more low refractive index layers and one or more high refractive index layers, alternating in their sequencing over one another. For example, the optical film 80 may include a low refractive index material L having a refractive index from about 1.3 to about 1.6, a medium refractive index material M having a refractive index from about 1.6 to about 1.7, or a high refractive index material H having a refractive index from about 1.7 to about 3.0. As used herein, the term "index" and "refractive index" both refer to the index of refraction of the material. Examples of suitable low refractive index materials include silica, fused silica, fluorine-doped fused silica, $MgF_2$, $CaF_2$, $AlF_3$, $YF_3$ and $YbF_3$. Examples of suitable medium refractive index material include $Al_2O_3$. Examples of suitable high refractive index materials include $ZrO_2$, $HfO_2$, $Ta_2O_5$, $Nb_2O_5$, $TiO_2$, $Y_2O_3$, $Si_3N_4$, $SrTiO_3$ and $WO_3$.

In further implementations, suitable high refractive index materials for the optical film 80 include AlN, $AlO_xN_y$, $SiO_xN_y$, and $Si_uAl_xO_yN_z$. As understood by those with ordinary skill in the field of the disclosure with regard to any of the foregoing materials (e.g., AlN) for the optical film 80, each of the subscripts, "u," "x," "y," and "z," can vary from 0 to 1, the sum of the subscripts will be less than or equal to one, and the balance of the composition is the first element in the material (e.g., Si or Al). In addition, those with ordinary skill in the field can recognize that "$Si_uAl_xO_yN_z$" can be configured such that "u" equals zero and the material can be described as "$AlO_xN_y$". Still further, the foregoing compositions for the optical film 80 exclude a combination of subscripts that would result in a pure elemental form (e.g., pure silicon, pure aluminum metal, oxygen gas, etc.). Finally, those with ordinary skill in the art will also recognize that the foregoing compositions may include other elements not expressly denoted (e.g., hydrogen), which can result in non-stoichiometric compositions (e.g., $SiN_x$ vs. $Si_3N_4$). Accordingly, the foregoing materials for the optical film can be indicative of the available space within a $SiO_2$—$Al_2O_3$—$SiN_x$—AlN or a $SiO_2$—$Al_2O_3$—$Si_3N_4$—AlN phase diagram, depending on the values of the subscripts in the foregoing composition representations.

In some embodiments, the source materials for the optical film 80 may also include transparent oxide coating (TCO) materials. Examples of suitable TCO materials may also include, but are not limited to, indium tin oxide (ITO), aluminum doped zinc oxide (AZO), zinc stabilized indium tin oxide (IZO), $In_2O_3$, and other binary, ternary or quarternary oxide compounds suitable for forming a doped metal oxide coating.

As used herein, the "$AlO_xN_y$," "$SiO_xN_y$," and "$Si_uAl_xO_yN_z$" materials in the disclosure include various aluminum oxynitride, silicon oxynitride and silicon aluminum oxynitride materials, as understood by those with ordinary skill in the field of the disclosure, described according to certain numerical values and ranges for the subscripts, "u," "x," "y," and "z". That is, it is common to describe solids with "whole number formula" descriptions, such as $Al_2O_3$. It is also common to describe solids using an equivalent "atomic fraction formula" description such as $Al_{0.4}O_{0.6}$, which is equivalent to $Al_2O_3$. In the atomic fraction formula, the sum of all atoms in the formula is 0.4+0.6=1, and the atomic fractions of Al and O in the formula are 0.4 and 0.6 respectively. Atomic fraction descriptions are described in many general textbooks and atomic fraction descriptions are often used to describe alloys. (See, e.g.: (i) Charles Kittel, "Introduction to Solid State Physics," seventh edition, John Wiley & Sons, Inc., NY, 1996, pp. 611-627; (ii) Smart and Moore, "Solid State Chemistry, An Introduction," Chapman & Hall University and Professional Division, London, 1992, pp. 136-151; and (iii) James F. Shackelford, "Introduction to Materials Science for Engineers," Sixth Edition, Pearson Prentice Hall, New Jersey, 2005, pp. 404-418.)

Again referring to the "$AlO_xN_y$," "$SiO_xN_y$," and "$Si_uAl_xO_yN_z$" materials in the disclosure, the subscripts allow those with ordinary skill in the art to reference these materials as a class of materials without specifying particular subscript values. That is, to speak generally about an alloy, such as aluminum oxide, without specifying the particular subscript values, we can speak of $Al_vO_x$. The description $Al_vO_x$ can represent either $Al_2O_3$ or $Al_{0.4}O_{0.6}$. If v+x were chosen to sum to 1 (i.e. v+x=1), then the formula would be an atomic fraction description. Similarly, more complicated mixtures can be described, such as $Si_uAl_vO_xN_y$, where again, if the sum u+v+x+y were equal to 1, we would have the atomic fractions description case.

Once again referring to the "$AlO_xN_y$," "$SiO_xN_y$," and "$Si_uAl_xO_yN_z$" materials in the disclosure, these notations allow those with ordinary skill in the art to readily make comparisons to these materials and others. That is, atomic fraction formulas are sometimes easier to use in comparisons. For instance; an example alloy consisting of $(Al_2O_3)_{0.3}(AlN)_{0.7}$ is closely equivalent to the formula descriptions $Al_{0.448}O_{0.31}N_{0.241}$ and also $Al_{367}O_{254}N_{198}$. Another example alloy consisting of $(Al_2O_3)_{0.4}(AlN)_{0.6}$ is closely equivalent to the formula descriptions $Al_{0.438}O_{0.375}N_{0.188}$ and $Al_{37}O_{32}N_{16}$. The atomic fraction formulas $Al_{0.448}O_{0.31}N_{0.241}$ and $Al_{0.438}O_{0.375}N_{0.188}$ are relatively easy to compare to one another; For instance, we see that Al decreased in atomic fraction by 0.01, O increased in atomic fraction by 0.065 and N decreased in atomic fraction by 0.053. It takes more detailed calculation and consideration to compare the whole number formula descriptions $Al_{367}O_{254}N_{198}$ and $Al_{37}O_{32}N_{16}$. Therefore, it is sometimes preferable to use atomic fraction formula descriptions of solids. Nonetheless, the use of $Al_vO_xN_y$ is general since it captures any alloy containing Al, O and N atoms.

The source materials of the optical film 80 may be deposited as a single layer film or a multilayer film, coating or structure. In some embodiments, a single layer film is formed using a low refractive index material L as the optical film source material. In other embodiments, a single layer film is formed using a $MgF_2$ optical coating source material. The single layer film may have a selected thickness, i.e., thickness 84 (see FIG. 1A). In some embodiments, the thickness 84 of a single layer or multilayer optical film 80 may be greater than or equal to 50 nm, 60 nm, or 70 nm. In some embodiments, the thickness 84 of the single layer or multilayer optical film 80 may be less than or equal to 2000 nm, 1500 nm, 1000 nm, 500 nm, 250 nm, 150 nm or 100 nm.

In further embodiments, the thickness 84 of the single layer or multilayer optical film 80 may be 500 nm or more, 1000 nm or more, 1500 nm or more, and all thickness values between these thicknesses. Thickness of the thin film elements (e.g., scratch-resistant film, layers thereof, etc.) as reported herein was measured by scanning electron microscope (SEM) of a cross-section, or by optical ellipsometry (e.g., by an n & k analyzer), or by thin film reflectometry. For multiple layer elements (e.g., a stack of layers), thickness measurements by SEM are preferred.

The source materials for the optical film 80 may also be deposited as a multilayer coating, film or structure. In some embodiments, the multilayer coating, film or structure of the optical film 80 may comprise alternating layers of a low refractive index material L, a medium refractive index material M, and a high refractive index material H. In other embodiments, the multilayer structure may comprise alternating layers of a high refractive index material H and one of (i) a low refractive index material L or (ii) a medium refractive index material M. The layers may be deposited such that the order of the layers is H(L or M) or (L or M)H. Each pair of layers, H(L or M) or (L or M)H, may form a coating period or period. The optical film 80 may comprise at least one coating period to provide the desired optical properties, including, for example and without limitation, anti-reflective properties. In some embodiments, the optical film 80 comprises a plurality of coating periods, wherein each coating period consisting of one high refractive index material and one of a low or medium refractive index material. The number of coating periods present in a multilayer coating may be from 1 to 1000. In some embodiments, the number of coating periods present in a multilayer coating may be from 1 to 500, from 2 to 500, from 2 to 200, from 2 to 100, or from 2 to 20.

The source materials of the optical film 80 may be selected such that the same refractive index materials are used in each coating period in some embodiments, or the optical film source materials may be selected such that different refractive index materials are used in each coating period in other embodiments. For example, in an optical film 80 having two coating periods, the first coating period may comprise $SiO_2$ alone and the second period may comprise $TiO_2/SiO_2$. The ability to vary the alternating layers and coating period may allow a complicated optical filter (having the desired optical properties, and including an AR coating) to be formed.

The thickness of each layer in a coating period of the optical film 80, i.e., the H layer and the L(or M) layer, may independently be from about 5 nm to about 200 nm, from about 5 nm to about 150 nm, or from about 25 nm to about 100 nm. The multilayer structure may have a thickness 84 from about 100 nm to about 2000 nm, from about 150 nm to about 1500 nm, from about 200 nm to about 1250 nm, or from about 400 nm to about 1200 nm.

With regard to the scratch-resistant film 90, it may include one or more scratch-resistant layers, films or coatings (e.g., diamond-like carbon, $Al_2O_3$, AlN, $AlO_xN_y$, $Si_3N_4$, $SiO_xN_y$, $Si_uAl_xO_yN_z$, TiN, TiC) as a single-layer structure or a multi-layer structure disposed over one or more primary surfaces 12, 14 of the substrate 10. As understood by those with ordinary skill in the field of the disclosure with regard to any of the foregoing materials (e.g., AlN) for the scratch-resistant film 90, each of the subscripts, "u," "x," "y," and "z," can vary from 0 to 1, the sum of the subscripts will be less than or equal to 1, and the balance of the composition is the first element in the material (e.g., Si or Al). In addition, those with ordinary skill in the field can recognize that "$Si_uAl_xO_yN_z$" can be configured such that "u" equals zero and the material can be described as "$AlO_xN_y$". Still further, the foregoing compositions for the scratch-resistant film 80 exclude a combination of subscripts that would result in a pure elemental form (e.g., pure silicon, pure aluminum metal, oxygen gas, etc.). Finally, those with ordinary skill in the art will also recognize that the foregoing compositions may include other elements not expressly denoted (e.g., hydrogen), which can result in non-stoichiometric compositions (e.g., $SiN_x$ vs. $Si_3N_4$). Accordingly, the foregoing materials for the optical film can be indicative of the available space within a $SiO_2$—$Al_2O_3$—$SiN_x$—AlN or a $SiO_2$—$Al_2O_3$—$Si_3N_4$—AlN phase diagram, depending on the values of the subscripts in the foregoing composition representations.

In some embodiments, a scratch-resistant film 90 in a multi-layer structure may further comprise an optical film, such as an AR film, that is comparable in structure and function to the optical film 80 disposed beneath it (see FIG. 1A). In a preferred embodiment, the scratch-resistant film 90 comprises an $AlO_xN_y$ material. In another preferred embodiment, the scratch-resistant film 90 comprises a $Si_uAl_xO_yN_z$ material. As shown in FIG. 1A, a scratch-resistant film 90 can be disposed between the ETC coating 70 and the optical film 80, all of which are disposed over the primary surface 12 of the substrate 10. According to some implementations, the scratch-resistant film 90 can also be disposed over the primary surface 14 of the substrate 10. The single layer or multilayer scratch-resistant film 90 may have a selected thickness, i.e., thickness 94 (see FIG. 1A). In some embodiments, the thickness 94 of a single layer or multilayer scratch-resistant film 90 may be greater than or equal to 50 nm, 60 nm, or 70 nm. In some embodiments, the thickness 94 of the single layer or multilayer scratch-resistant film 90 may be less than or equal to 3000 nm, 2500 nm, 2000 nm, 1500 nm, 1000 nm, 500 nm, 250 nm, 150 nm or 100 nm. In further embodiments, the thickness 94 of the single layer or multilayer scratch-resistant film 90 may be 500 nm or more, 1000 nm or more, 1500 nm, 2500 nm or more, 3000 nm or more, 3500 nm or more, 4000 nm or more, 4500 nm or more, 5000 nm or more, 7500 nm or more, up to 10000 nm, and all thickness values between or up to these thickness values. In some embodiments, the scratch-resistant film 90 is the thickest film in the stack of film layers disposed over a surface of the substrate.

In preferred embodiments of the article 100a as shown in FIG. 1A, the total of the thickness 84 of the optical film 80, the thickness 94 of the scratch-resistant film 90 and any other films below the ETC coating 70 is 500 nm or more. In other implementations of the article 100a, the total thickness of the optical and scratch-resistant films 80, 90 (and any other films below the ETC coating 70) is 500 nm or more, 600 nm or more, 700 nm or more, 800 nm or more, 900 nm or more, 1000 nm or more, 1100 nm or more, 1200 nm or more, 1300 nm or more, 1400 nm or more, 1500 nm or more, 2000 nm or more, 2500 nm or more, 3000 nm or more, 3500 nm or more, 4000 nm or more, 4500 nm or more, 5000 nm or more, 6000 nm or more, 7000 nm or more, 8000 nm or more, 9000 nm or more, 10000 nm or more, and all total thickness values between or up to these thickness values.

Figure 1B:
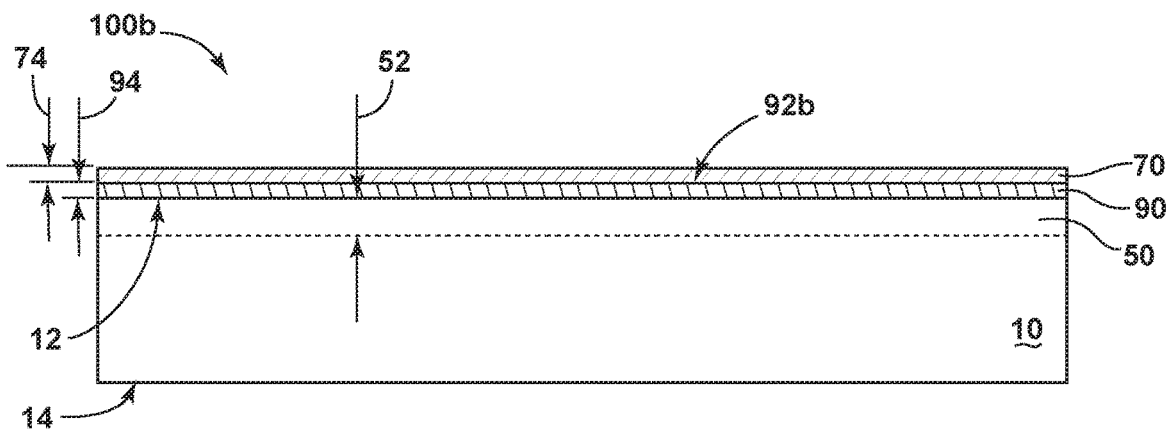
FIG. 1B is a cross-sectional, schematic view of a glass article comprising a glass substrate with a scratch-resistant film and an ETC coating disposed over the substrate, according to some aspects of the disclosure.

Referring now to FIG. 1B, an article 100b is depicted that includes: a glass, glass-ceramic or ceramic substrate 10 comprising a glass, glass-ceramic or ceramic composition. The article 100b depicted in FIG. 1B is similar to the article 100a depicted in FIG. 1A, and like-numbered elements have the same or substantially similar structure and function. The primary difference between article 100a and article 100b is that the latter does not require an optical film, such as the optical film 80 depicted in FIG. 1A. With particular regard to the article 100b, its substrate 10 comprises a pair of opposing primary surfaces 12, 14. Further, the article 100b includes a scratch-resistant film 90 disposed over the primary surface 12. The article 100b further includes an easy-to-clean (ETC) coating 70 disposed over the scratch-resistant film 90. In particular, as shown in FIG. 1B, the ETC coating 70 is located on the outer surface 92b of the scratch-resistant film 90. Also as shown in FIG. 1B, the scratch-resistant film 90 has a thickness 94, and the ETC coating 70 has a thickness 74.

In preferred embodiments of the article 100b as shown in FIG. 1B, the total of the thickness 94 of the scratch-resistant film 90 and the thickness of any other films (e.g., an optical film comparable in structure and function to the optical film 80 depicted in FIG. 1A) disposed below it and above the primary surface 12 of the substrate 10 and/or disposed above it and below the ETC coating 70 is 500 nm or more. In other implementations of the article 100b, the total thickness of the scratch-resistant film 90 and any other layers present below the ETC coating 70 is 500 nm or more, 600 nm or more, 700 nm or more, 800 nm or more, 900 nm or more, 1000 nm or more, 1100 nm or more, 1200 nm or more, 1300 nm or more, 1400 nm or more, 1500 nm or more, 2000 nm or more, 2500 nm or more, 3000 nm or more, 3500 nm or more, 4000 nm or more, 4500 nm or more, 5000 nm or more, and all total thickness values between these thicknesses.

Figure 1C:
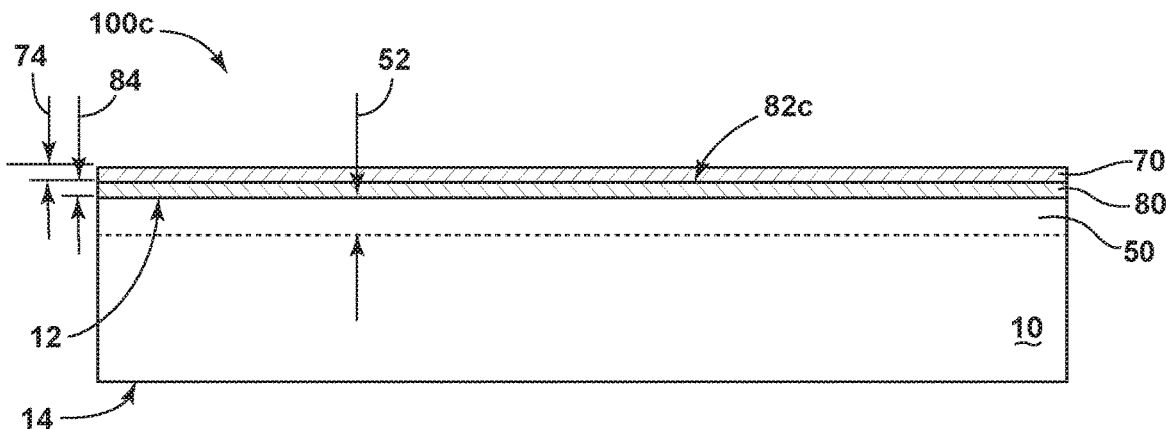
FIG. 1C is a cross-sectional, schematic view of a glass article comprising a glass substrate with an optical film and an ETC coating disposed over the substrate, according to some aspects of the disclosure.

Referring now to FIG. 1C, an article 100c is depicted that includes: a glass, glass-ceramic or ceramic substrate 10 comprising a glass, glass-ceramic or ceramic composition. The article 100c depicted in FIG. 1C is similar to the article 100a depicted in FIG. 1A, and like-numbered elements have the same or substantially similar structure and function. The primary difference between article 100a and article 100c is that the latter does not require a scratch-resistant film, such as the scratch-resistant film 90 depicted in FIG. 1A. With particular regard to the article 100c, its substrate 10 comprises a pair of opposing primary surfaces 12, 14. Further, the article 100c includes an optical film 80 disposed over the primary surface 12. The article 100c further includes an easy-to-clean (ETC) coating 70 disposed over the optical film 80. In particular, as shown in FIG. 1C, the ETC coating 70 is located on the outer surface 82c of the optical film 80. Also as shown in FIG. 1C, the optical film 80 has a thickness 84, and the ETC coating 70 has a thickness 74.

In preferred embodiments of the article 100c as shown in FIG. 1C, the total of the thickness 84 of the optical film 80 and the thickness of any other films (e.g., a scratch-resistant film comparable in structure to the scratch-resistant film 90 depicted in FIG. 1B) disposed below it and above the primary surface 12 of the substrate 10 and/or disposed above it and below the ETC coating 70 is 500 nm or more. In other implementations of the article 100c, the total thickness of the optical film 80 and any other layers present below the ETC coating 70 is 500 nm or more, 600 nm or more, 700 nm or more, 800 nm or more, 900 nm or more, 1000 nm or more, 1100 nm or more, 1200 nm or more, 1300 nm or more, 1400 nm or more, 1500 nm or more, 2000 nm or more, 2500 nm or more, 3000 nm or more, 3500 nm or more, 4000 nm or more, 4500 nm or more, 5000 nm or more, and all total thickness values between these thicknesses.

The optical film 80 and the scratch-resistant film 90, as present in the articles 100a-c, can be deposited using a variety of methods including physical vapor deposition ("PVD"), electron beam deposition ("e-beam" or "EB"), ion-assisted deposition-EB ("IAD-EB"), laser ablation, vacuum arc deposition, thermal evaporation, sputtering, plasma enhanced chemical vapor deposition (PECVD) and other similar deposition techniques.

Referring again to FIGS. 1A-1C, the outer surface 92a, 92b, 82c of the respective scratch-resistant film 90 and optical film 80 employed in the articles 100a-c beneath the ETC coating 70 includes a low surface roughness, preferably a surface roughness ($R_q$) of less than about 5 nm, and more preferably less than about 1.0 nm. In embodiments, the surface roughness ($R_q$) is held to about 1.0 nm or less, about 0.9 nm or less, about 0.8 nm or less, about 0.7 nm or less, 0.6 nm or less, 0.5 nm or less, 0.4 nm or less, 0.3 nm or less, 0.2 nm or less, 0.1 nm or less, and all levels of surface roughness in between these surface roughness values. Without being bound by theory, controlling to a low value the surface roughness of the film, layer or structure of the optical film 80 and/or scratch-resistant film 90 residing beneath the ETC coating 70 tends to significantly increase the durability of the ETC coating 70, as subjected to mechanical interactions. As used herein, "surface roughness ($R_a$)" and "surface roughness (Rq)" are given by:

$$R_a = \frac{1}{n}\sum_{i=1}^{n} |y_i| \text{ and } R_q = \sqrt{\frac{1}{n}\sum_{i=1}^{n} y_i^2}$$

where $y_i$ is the distance of a given measurement, i, from the mean roughness and n is the number of equally spaced points along the outer surface being measured for surface roughness. Further, the surface roughness (i.e., $R_a$ and $R_q$) of outer surfaces, e.g., surfaces 92a, 92b and 82c (see FIGS. 1A-1C) can be measured by atomic force microscopy (AFM) and/or laser interferometry (e.g., with a Zygo® white light interferometer) techniques as readily understood by those with ordinary skill in the art.

According to some embodiments, the articles 100a-c depicted in FIGS. 1A-1C employ a scratch-resistant film 90 and/or optical film 80 (as the case may be) with an average hardness of 12 GPa or more. In some aspects, the average hardness of these films can be about 10 GPa or more, 11 GPa, or more, 12 GPa or more, 13 GPa or more, 14 GPa or more, 15 GPa or more, 16 GPa or more, 17 GPa or more, 18 GPa or more, 19 GPa or more, 20 GPa or more, and all average hardness values between these values. As used herein, the "average hardness value" is reported as an average of a set of measurements on the outer surface 92a, 92b, 82c of the optical and/or scratch-resistant films 80, 90 using a nanoindentation apparatus. More particularly, hardness of thin film coatings as reported herein was determined using widely accepted nanoindentation practices. See: Fischer-Cripps, A. C., Critical Review of Analysis and Interpretation of Nanoindentation Test Data, Surface & Coatings Technology, 200, 4153-4165 (2006) (hereinafter "Fischer-Cripps"); and Hay, J., Agee, P, and Herbert, E., Continuous Stiffness measurement During Instrumented Indentation Testing, Experimental Techniques, 34 (3) 86-94 (2010) (hereinafter "Hay"). For coatings, it is typical to measure hardness and modulus as a function of indentation depth. So long as the coating is of sufficient thickness, it is then possible to isolate the properties of the coating from the resulting response profiles. It should be recognized that if the coatings are too thin (for example, less than ~500 nm), it may not be possible to completely isolate the coating properties as they can be influenced from the proximity of the substrate which may have different mechanical properties. See Hay. The methods used to report the properties herein are representative of the coatings themselves. The process is to measure hardness and modulus versus indentation depth out to depths approaching 1000 nm. In the case of hard coatings on a softer glass, the response curves will reveal maximum levels of hardness and modulus at relatively small indentation depths (less than or equal to about 200 nm). At deeper indentation depths both hardness and modulus will gradual diminish as the response is influenced by the softer glass substrate. In this case the coating hardness and modulus are taken be those associated with the regions exhibiting the maximum hardness and modulus. In the case of soft coatings on a harder glass substrate, the coating properties will be indicated by lowest hardness and modulus levels that occur at relatively small indentation depths. At deeper indentation depths, the hardness and modulus will gradually increase due to the influence of the harder glass. These profiles of hardness and modulus versus depth can be obtained using either the traditional Oliver and Pharr approach (as described in Fischer-Cripps) or by the more efficient continuous stiffness approach (see Hay). Extraction of reliable nanoindentation data requires that well-established protocols be followed. Otherwise, these metrics can be subject to significant errors. The elastic modulus and hardness values reported herein for such thin films were measured using known diamond nanoindentation methods, as described above, with a Berkovich diamond indenter tip.

The articles 100a-c described herein may further comprise a capping layer of $SiO_2$ (not shown in FIGS. 1A-1C) on the last layer (of an optical film 80, scratch-resistant coating 90 or primary surface 12, 14 of the substrate 10) in contact with the ETC coating 70. In some aspects, the capping layer can improve the bond between the component of the article 100a-c having the capping layer and the bound ETC component. In some embodiments, the capping layer is added when the last layer of the last coating period of the optical film 80 is a high refractive index layer. In other embodiments, the capping layer is added when the last layer of the last coating period of the optical film 80 is not $SiO_2$. In further embodiments, the capping layer may optionally be added when the last layer of the last coating period of the optical film 80 is $SiO_2$. In some embodiments, the capping layer may have a thickness from about 20 nm to about 400 nm, from about 20 nm to about 300 nm, from about 20 nm to about 250 nm, or from about 20 nm to about 200 nm. In other embodiments, the capping layer may have a thickness from about 1 nm to about 400 nm, from about 1 nm to about 300 nm, from about 1 nm to about 200 nm, from about 1 nm to about 100 nm, from about 1 nm to about 50 nm, or from about 1 nm to about 10 nm.

In implementations of the articles 100a-c, the easy-to-clean (ETC) coating 70 comprises a fluorinated material, e.g., a perfluoropolyether (PFPE) silane, a pefluoroalkylether, a PFPE oil or other suitable fluorinated material. According to some embodiments, the thickness 74 of the ETC coating 70 is from about 1 nm to about 20 nm. In other aspects, the thickness 74 of the ETC coating ranges from 1 nm to about 200 nm, 1 nm to about 100 nm, and 1 nm to about 50 nm. In some embodiments, the ETC coating 70 may have a thickness of from about 0.5 nm to about 50 nm, from about 1 nm to about 25 nm, from about 4 nm to about 25 nm, or from about 5 nm to about 20 nm. In other embodiments, the ETC coating may have a thickness of from about 10 nm to about 50 nm.

As understood by those with ordinary skill in the field of the disclosure, various source materials can be used to form the ETC coating 70 of the articles 100a-c depicted in FIGS.

1A-1C. ETC coating source materials may comprise perfluoropolyether (PFPE) silanes, perfluoropolyether (PFPEs) alkoxy silanes, copolymers of these PFPEs and mixtures of these PFPEs. In certain, exemplary embodiments of the articles of the disclosure, the ETC coating 70 can comprise a perfluoropolyether (PFPE) silane of formula. $[CF_3CF_2CF_2O)_a]_y SiX_{4-y}$ where a is from 5 to 50, y=1 or 2, and X is —Cl, acetoxy, —OCH$_3$ or OCH$_2$H$_3$, wherein the total perfluoropolyether chain length is 6-130 carbon atoms from the silicon atom to the end of the chain at its greatest length. In other aspects, "a" in the above formula can range from about 10 to 30. Further, it should be understood that the above PFPE formula is one of many suitable types of PFPE suitable for use in the ETC coatings of the disclosure; consequently, it is offered as an exemplary chemistry that is in no way intended to limit the formulas or mixtures of formulas suitable for the ETC coatings of the disclosure. As such, other PFPEs can be employed in the ETC coatings that vary in the structure of the perfluoropolyether chain and/or attachment chemistry relative to the exemplary form provided above. For example, an Optool™ UF503 fluorinated coating material from Daikin Industries is another suitable PFPE that can be employed for the ETC coating 70. As used herein, the length of the carbon chain in nanometers ("nm") is the product of the number of carbon-carbon bonds along the greatest length of the chain multiplied by the carbon-carbon single bond length of 0.154 nm. In some embodiments, the carbon chain length of the perfluoropolyether (PFPE) group can range from about 0.1 nm to about 50 nm, from about 0.5 nm to about 25 nm, or from about 1 nm to about 20 nm.

As also noted earlier, embodiments of the ETC coating 70 employed in the articles 100a-c (see FIGS. 1A-1C) can comprise a PFPE oil. According to some embodiments, the PFPE oil employed in the ETC coating 70 can be solubilized in an ETC component hound directly to the optical film 80 and/or scratch-resistant film 90. In general, PFPE oils are characterized by oxidation resistance. In other aspects, the PFPE oil of the ETC coating 70 is a discreet layer disposed over an ETC component bound directly to the optical film 80 and/or scratch-resistant film 90. In further aspects, the PFPE oil of the ETC coating 70 is a combination of solubilized and discreet layers. According to some embodiments, the PFPE oil employed in the ETC coating 70 can comprise a Solvay Fomblin® Z type oil, a Fomblin® Y type oil, a Fomblin® K type oil, Krytox™ K type oil from The Chemours Company, a Demnum™ type oil from Daikin Industries or other similar PFPE oil.

In embodiments, articles 100a-c of the disclosure (see FIGS. 1A-1C) include an ETC coating 70 that is characterized by a high durability. Accordingly, some embodiments of the articles 100a-c an exposed surface of the ETC coating 70 comprises an average contact angle with water of 70 or more degrees after being subjected to 2000 reciprocating cycles under a load of 1 kg, according to a Steel Wool Test (i.e., as described below). The exposed surface of the ETC coating 70 can also comprise an average contact angle with water of 70 or more degrees after being subjected to 3500 reciprocating cycles under a load of 1 kg according to the Steel Wool Test. In other aspects, an average contact angle of 70 or more degrees, 75 degrees, 80 degrees, 85 degrees, 90 degrees, 95 degrees, 100 degrees, 105 degrees, 110 degrees, or 115 degrees (including all average contact angles between these levels) with water is retained by the exposed surface of the ETC coating 70 after 2000, or 3500, of such cycles according to the Steel Wool Test.

As used herein, the "Steel Wool Test" is a test employed to determine the durability of an ETC coating 70 disposed over a glass, glass-ceramic or ceramic substrate (e.g., substrate 10 as shown in FIGS. 1A-1C) employed in the articles of the disclosure (e.g., articles 100a-c depicted in FIGS. 1A-1C). At the beginning of a Steel Wool Test, a water contact angle is measured on the particular sample one or more times to obtain a reliable initial water contact angle. These water contact angle measurements can be conducted using a Krüss GmbH DSA100 drop shape analyzer or similar instrument. After the initial water contact angle is measured, a pad of Bonstar #0000 steel wool is affixed to an arm of a Taber® Industries 5750 linear abraser instrument. The steel wool pad was then allowed to make contact with the sample (on the ETC coating) under a load of 1 kg and set to reciprocate at 60 cycles/min. The average contact angle is then measured on the sample after 2000 cycles, 3500 cycles and/or another specified duration.

In embodiments, the articles 100a-c (see FIGS. 1A-1C) can comprise a haze through the ETC coating 70 and the glass, glass-ceramic or ceramic substrate 10 of less than or equal to about 5 percent. In certain aspects, the haze is equal to or less than 5 percent, 4.5 percent, 4 percent, 3.5 percent, 3 percent, 2.5 percent, 2 percent, 1.5 percent, 1 percent, 0.75 percent, 0.5 percent, or 0.25 percent (including all levels of haze between these levels) through the ETC coating 70 and the glass substrate 10. In other embodiments, the articles 100a-c comprise an optical film 80 and/or scratch-resistant film 90 that is by nature hazy; consequently, the level of haze through the ETC coating 70, the optical film 80 and/or scratch-resistant film 90, and the substrate 10 can be set at 10 percent or higher, 5 percent or higher, or another haze level above these lower haze limits. In other implementations, articles 100a-c that incorporate appreciable haze (>5%) as part of their function, and also comprise an ETC coating with high durability, e.g., as comprising an average contact angle with water of 100 degrees or more after being subjected to 2000 reciprocating cycles, or 3500 reciprocating cycles, under a load of 1 kg according to the Steel Wool Test. As used herein, the "haze" attributes and measurements reported in the disclosure are as measured on, or otherwise based on measurements from, a BYK-Gardner haze meter using an aperture over the source port having a dimeter of 7 mm.

The ETC coating 70 employed in the articles 100a-c of the disclosure can be applied in various ways over the outer surfaces 92a, 92b and 82c of the scratch-resistant films 90 and optical films 80 (see FIGS. 1A-1C). According to some embodiments, the ETC coating 70 can be deposited by various methods, including but not limited to, spray coating, dip coating, spin coating, and vapor deposition. Vapor deposition approaches for depositing the ETC coating 70 can include, but are not limited to, physical vapor deposition ("PVD"), electron beam deposition ("e-beam" or "EB"), ion-assisted deposition-EB ("IAD-EB"), laser ablation, vacuum arc deposition, thermal evaporation, sputtering, plasma enhanced chemical vapor deposition (PECVD) and other similar vapor deposition techniques.

EXAMPLES

The following examples represent certain non-limiting embodiments of the disclosure.

Example 1

Glass article samples were prepared that include Corning® Code 2320 glass substrates. These samples had a thickness of 1 mm and were ion-exchanged to develop a compressive stress region with a DOC of 47.1 μm and a maximum compressive stress of 883.7 MPa. Further, a $SiO_2$ capping layer was deposited on these glass substrates by PVD immediately prior to application of an ETC coating. The ETC coating (i.e., a Ceko Co., Ltd. ETC coating with Fomblin-type PFPE structure) was also applied by PVD under a combination of temperature and time conditions suitable as understood by those with ordinary skill for this particular Ceko ETC coating. These samples were deemed as a control and labeled "Glass" (see FIG. 2). A separate group of samples was prepared with three sputtered $AlO_xN_y$/$SiO_2$-based optical and scratch-resistant film structures, P86, P92, and P95, having a total thickness of about 2192 nm, 2283 nm, and 2429 nm, respectively, with an outermost $SiO_2$ capping layer (i.e., having thicknesses of 14 nm, 65 nm and 82.2 nm for the P86, P92 and P95 structures, respectively), followed by an ETC coating as employed in the "Glass" samples. These samples are deemed as comparative samples with regard to the articles of the disclosure and labeled "Comp. Ex. 2A", "Comp. Ex. 2B" and "Comp. Ex. 2C" in FIG. 2.

Figure 2:
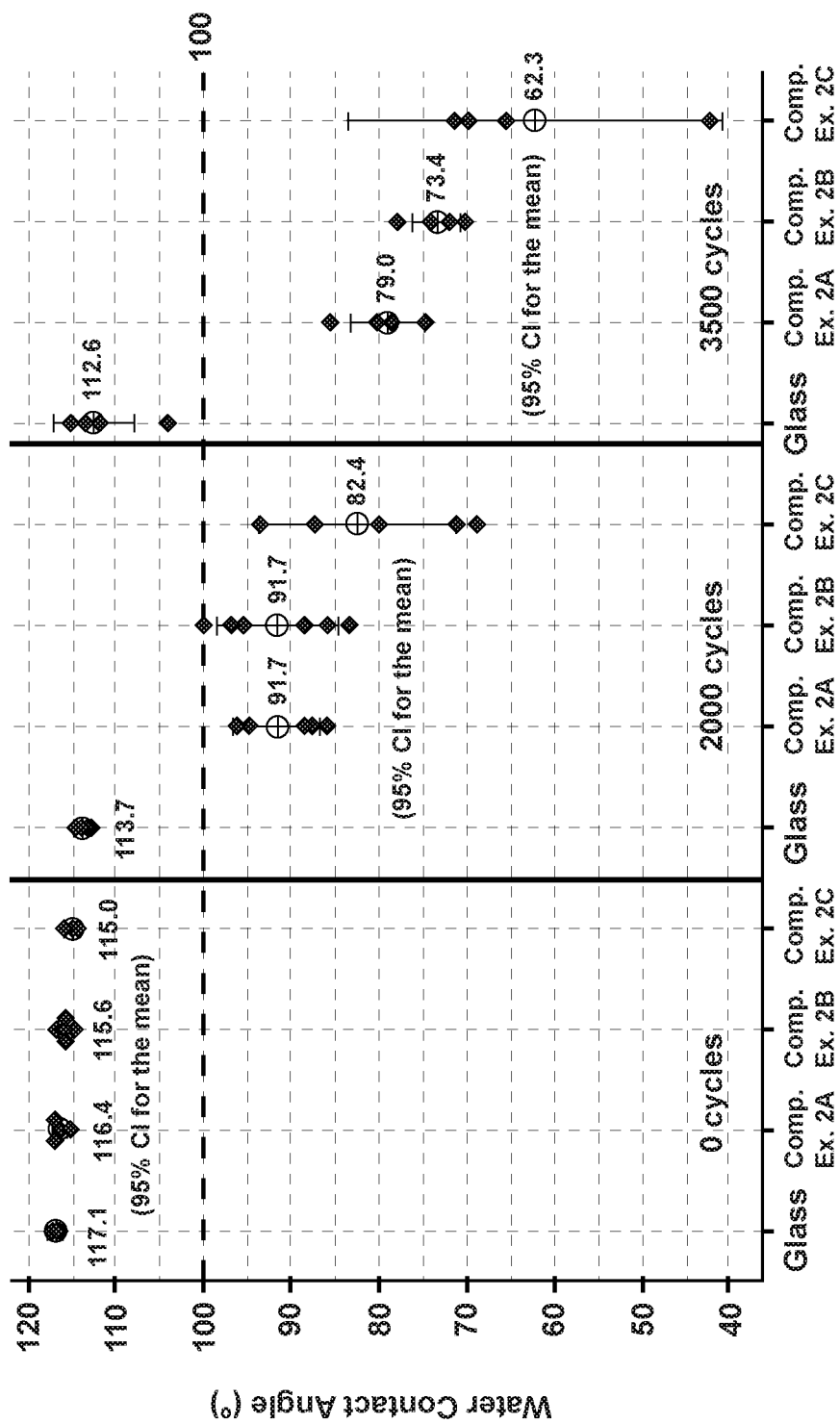
FIG. 2 is a plot of water contact angle vs. reciprocating cycles of a Steel Wool Test on control samples of Corning® Code 5318 glass with an ETC coating and comparative samples of Corning® Code 5318 glass with optical and scratch-resistant films with an ETC coating.

Referring now to FIG. 2, a plot of water contact angle vs. reciprocating cycles of a Steel Wool Test conducted on the "Glass" and "Comp. Ex. 2A, 2B and 2C" samples is provided. FIG. 2 shows that the durability of the ETC coating is significantly reduced in the samples having the $AlO_xN_y$/$SiO_2$-based optical and scratch-resistant film structures as compared to the ETC coating on the "Glass" samples without the optical and scratch-resistant films. At zero cycles, the "Glass" and "Comp. Ex. 2A, 2B and 2C" samples were measured with a contact angle from about 115.0 to 117.1 degrees. During the Steel Wool Test, however, the water contact angle falls below 100 degrees for the "Comp. Ex. 2A, 2B and 2C" samples after 2000 cycles (e.g., from 82.4 to 91.7 degrees) and continues to fall, as measured after 3500 cycles (e.g., from 62.3 to 79.0 degrees). In comparison the control "Glass" samples remained at 113.7 and 112.6 degrees at 2000 and 3500 cycles, respectively, during the Steel Wool Test.

Further, atomic force microscopy (AFM) measurements were made on the "Glass" control samples and the "Comp. Ex. 2A," "Comp. Ex. 2B" and "Comp. Ex. 2C" samples to determine surface roughness and the thickness of the top-most $SiO_2$ layer in these structures that resides beneath the ETC coating. Table 1 below shows the results of these measurements for all of the samples except the "Comp. Ex. 2A" samples. In view of the results in Table 1 and the plot shown in FIG. 2 (which does include data from the "Comp. Ex. 2A" samples), it is believed that the surface roughness of the top-most $SiO_2$ layer of the "Glass" control samples and the optical/scratch-resistant film structure of the "Comp. Ex. 2A," "Comp. Ex. 2B" and "Comp. Ex. 2C" samples influences ETC coating durability, as quantified by the Steel Wool Test.

TABLE 1

| | Surface roughness, $R_q$ (nm) | $SiO_2$ thickness (nm) | Contact Angle after 0 cycles (°) | Contact Angle after 2000 cycles (°) | Contact Angle after 3500 cycles (°) |
|---|---|---|---|---|---|
| Glass | 0.22 | 14 | 117.1 | 113.7 | 112.6 |
| Comp. Ex. 2B | 2.86 | 83 | 115.6 | 91.7 | 73.4 |
| Comp. Ex. 2C | 3.09 | 19 | 115.0 | 82.4 | 62.3 |

Example 2

Figure 3A:
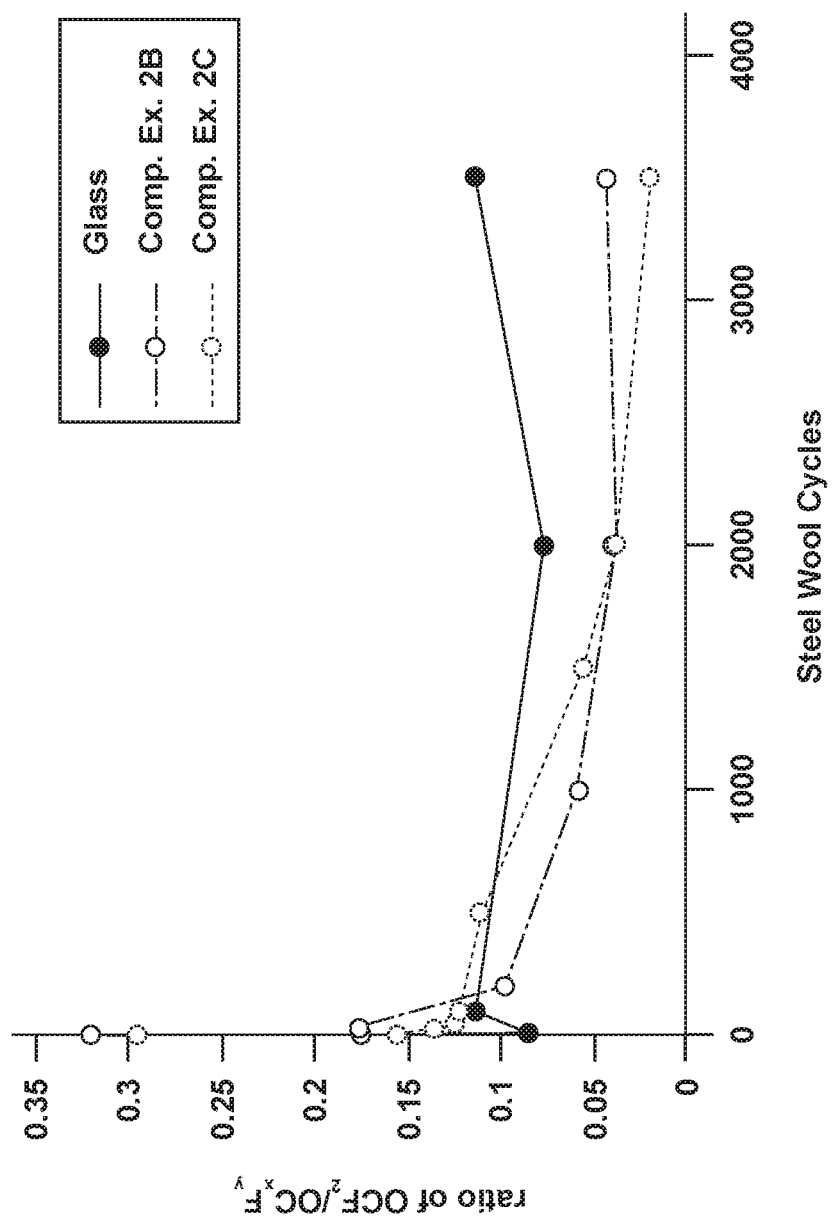
FIG. 3A is a plot of the ratio of $OCF_2/OC_xF_y$ species in the wear track of an ETC coating from a Steel Wool Test as measured by x-ray photoelectron spectroscopy (XPS) vs. reciprocating cycles during the Steel Wool Test on samples of Corning® Code 5318 glass with an ETC coating and comparative samples of Corning® Code 5318 glass with optical and scratch-resistant films with an ETC coating.

FIG. 3A is a plot of the ratio of $OCF_2$/$OC_xF_y$ species in the wear track of an ETC coating, as measured by x-ray photoelectron spectroscopy (XPS). In particular, the XPS measurements shown in FIG. 3A are plotted vs. reciprocating cycles during the Steel Wool Test on control samples of Corning® Code 5318 glass with an ETC coating (i.e., the "Glass" samples from Example 1) and on comparative samples of Corning® Code 5318 glass with optical and scratch-resistant films with an ETC coating (i.e., the "Comp. Ex. 2B" and "Comp. Ex. 2C"). As shown in the data presented in FIG. 3A associated with the comparative samples with optical and scratch-film structures, the decrease in the $OCF_2$/$OC_xF_y$ ratio as a function of cycles during the Steel Wool test is indicative of the degradation of the Fomblin-type structure in the ETC coating during the mechanical abrasion of the Steel Wool Test. By 2000 cycles on test, the $OCF_2$/$OC_xF_y$ ratio is about $\frac{1}{6}^{th}$ of its initial value at 0 cycles. It is also noteworthy that the $OCF_2$/$OC_xF_y$ ratio does not degrade as a function of Steel Wool Test cycles for the control sample.

Figure 3B:
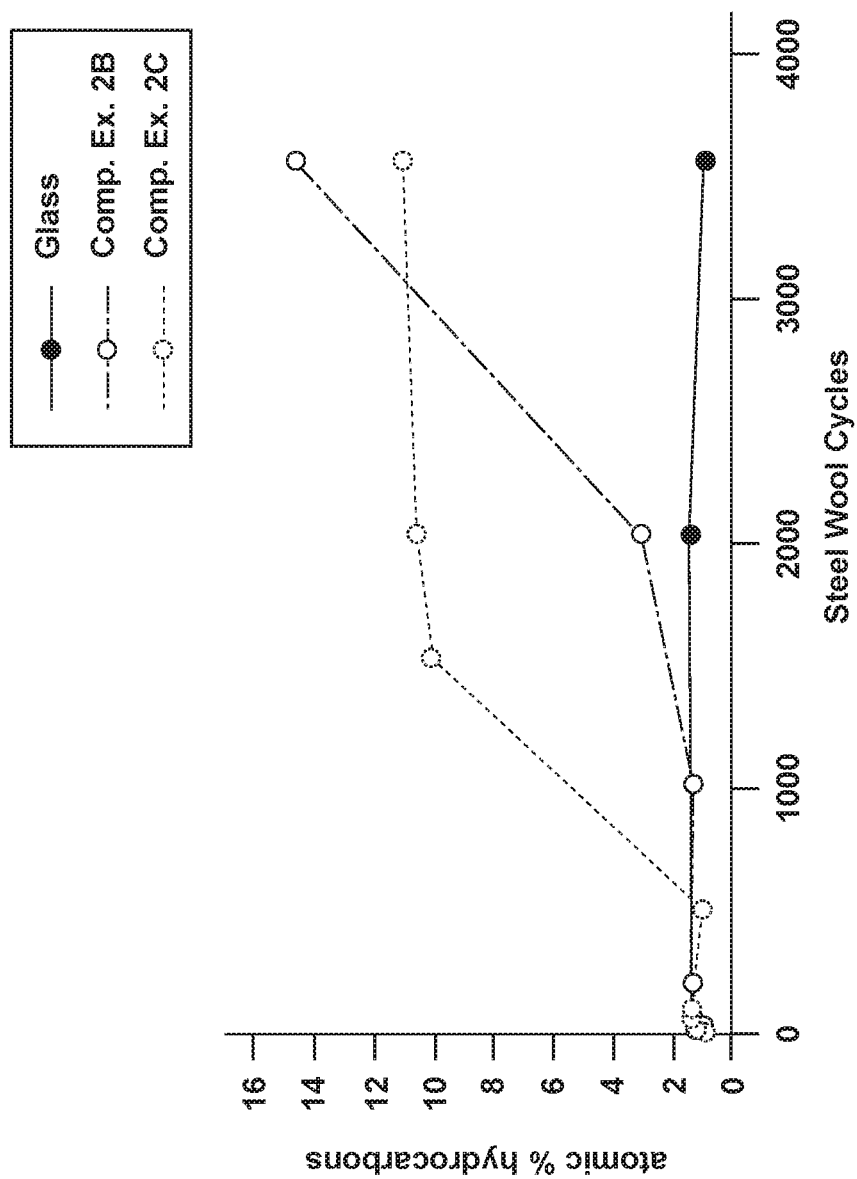
FIG. 3B is a plot of the atomic percent of total carbon in the wear track of an ETC coating from a Steel Wool Test as measured by x-ray photoelectron spectroscopy (XPS) vs. reciprocating cycles during the Steel Wool Test on the same samples as shown in FIG. 3A.

FIG. 3B is a plot of the atomic percent of total carbon in the wear track of an ETC coating, as measured by x-ray photoelectron spectroscopy (XPS). In particular, the XPS measurements shown in FIG. 3B are plotted vs. reciprocating cycles during the Steel Wool Test on control samples of Corning® Code 5318 glass with an ETC coating (i.e., the "Glass" samples from Example 1) and on comparative samples of Corning® Code 5318 glass with optical and scratch-resistant films with an ETC coating (i.e., the "Comp. Ex. 2B" and "Comp. Ex. 2C"). As shown in the data presented in FIG. 3B associated with the comparative samples with optical and scratch-film structures, the hydrocarbon fraction is increased in the comparative samples as the Fomblin-type structure in the ETC coating is degraded during the mechanical abrasion of the Steel Wool Test. It is also noteworthy that the amount of hydrocarbons is essentially unchanged as a function of Steel Wool Test cycles for the control sample.

Taken together, and without being bound by theory, it is believed that the data in FIGS. 3A and 3B suggest that the mechanism of degradation of the ETC coating during the Steel Wool Test is not removal of the bonded ETC portion at the silane head group, but rather polymer chain breakage along the pefluoroalkylether structure. As such, it is also believed that the increased roughness associated with the underlying optical and scratch-resistant films of the comparative samples (i.e., as relative to the control sample without such films) leads to increased ETC degradation during the Steel Wool Test.

Example 3

Glass article samples were prepared that include Corning® Code 5318 glass substrates. These samples had a thickness of 0.5 mm and were ion-exchanged to develop a compressive stress region with a DOC of 81 μm and a maximum compressive stress of 840 MPa. Two groups of these samples were polished to a surface roughness ($R_a$) of 2 nm and 20 nm, respectively, and one group was left in an unpolished state with a surface roughness ($R_a$) of 0.2 nm. Further, a 10 nm $SiO_2$ capping layer was deposited on all of these glass substrates by a PVD process. An ETC coating (i.e., a Daikin UF505 ETC coating) was then applied by a spray process and cured on all of these samples for 120° C.

for 30 minutes followed by a 10 minute rinse in 3M™ Novec™ 7200 Engineered Fluid with sonication.

Figure 4:
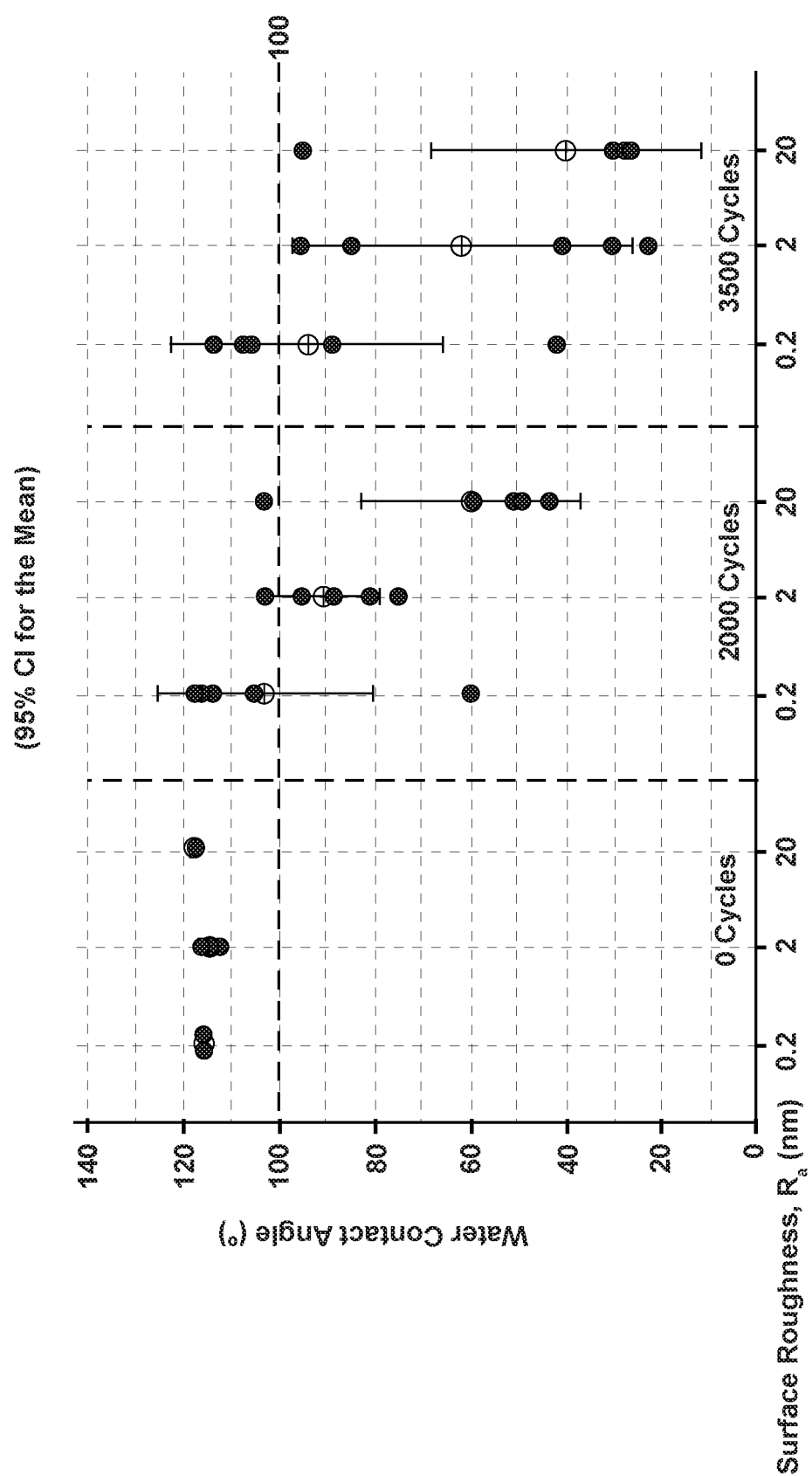
FIG. 4 is a plot of water contact angle vs. reciprocating cycles of a Steel Wool Test on control samples of unpolished Corning® Code 5318 glass with an ETC coating and inventive samples of polished Corning® Code 5318 glass (polished to 2 nm and 20 nm of $R_a$ surface roughness) with an ETC coating, according to some aspects of the disclosure.

FIG. 4 is a plot of water contact angle vs. reciprocating cycles of a Steel Wool Test, as conducted on the samples prepared according to this Example. FIG. 4 shows that the surface roughness of the outer surface beneath the ETC coating plays a substantial role in the durability of the ETC coating. In particular, the samples having an outer surface with a surface roughness ($R_a$) of 0.2 nm remained with a water contact angle of about 100 degrees after 2000 cycles, and after 3500 cycles, of the Steel Wool Test. In contrast, the samples having an outer surface with a surface roughness ($R_a$) of 2 nm and 20 nm degraded during the Steel Wool Test, such that a water contact angle of less than 100 degrees was observed after 2000 cycles, and after 3500 cycles, during the Steel Wool Test.

Example 4

Glass article samples were prepared that include Corning® Code 5318 glass substrates. These samples had a thickness of 1.0 mm and were ion-exchanged to develop a compressive stress region with a DOC of 70.5 μm and a maximum compressive stress of 812.7 MPa. Further, a $SiO_2$ capping layer was deposited on these glass substrates with a Plasma-Therm Versaline system using a high density plasma chemical vapor deposition (HDPCVD) process. In particular, $SiO_2$ layers were deposited with varying thicknesses and surface roughness levels (e.g., from 18.5 to 368.9 nm in thickness and from 0.329 nm to 1.52 nm in surface roughness, $R_q$) with the HDPCVD process, with no post-deposition polishing steps, to develop six groups of samples. The surface roughness and thickness data associated with these samples is listed below in Table 2, both of which were measured using AFM techniques as understood by those with ordinary skill in the field of this disclosure. Finally, an ETC coating (i.e., a Daikin UF503 ETC coating) was then applied by a spray process and cured on all of these samples for 120° C. for 30 minutes followed by a 10 minute rinse in 3M™ Novec™ 7200 Engineered Fluid with sonication.

Figure 5:
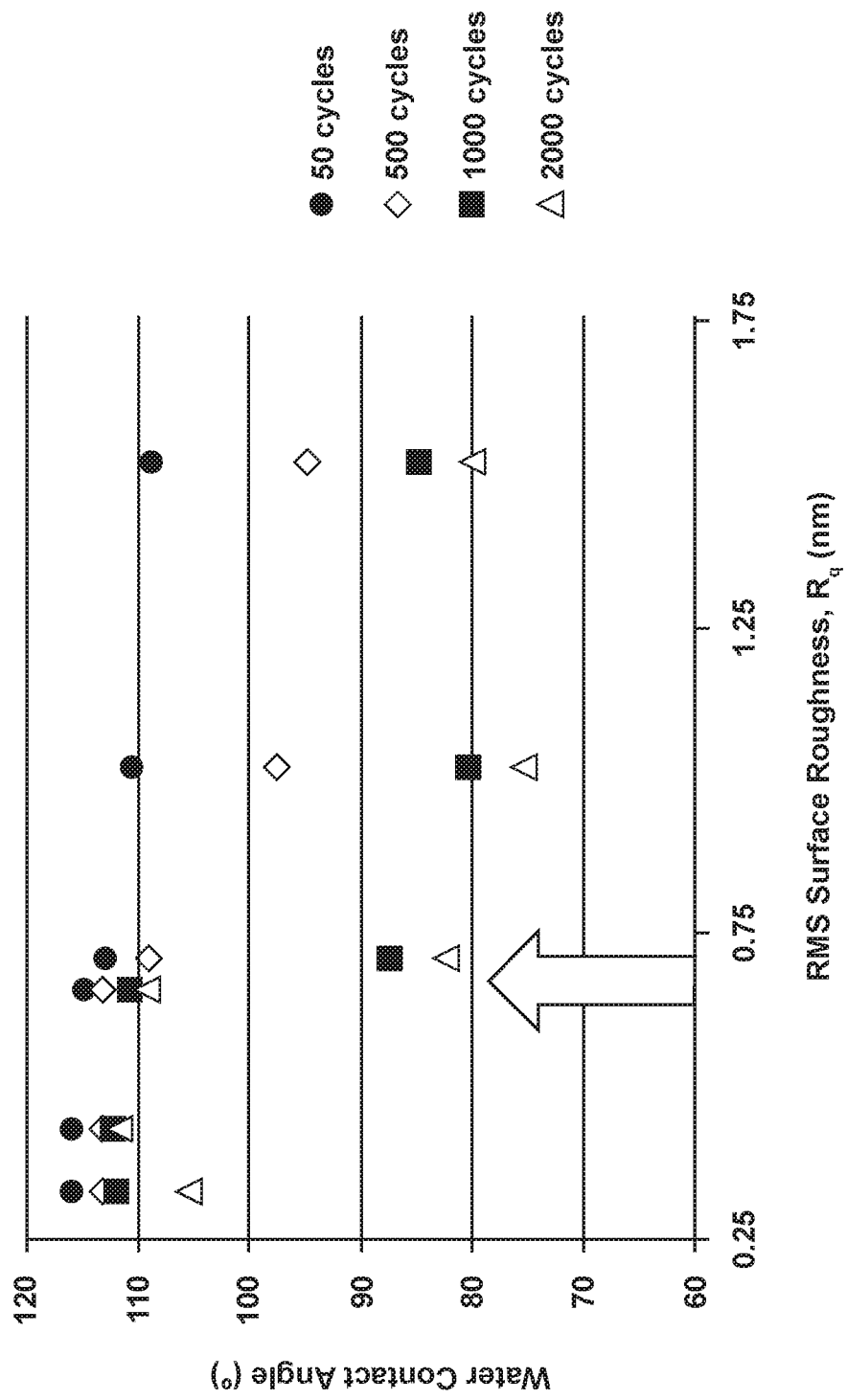
FIG. 5 is a plot of water contact angle vs. reciprocating cycles of a Steel Wool Test on inventive samples of Corning® Code 5318 glass having a silica film of varying degrees of surface roughness (i.e., from 0.33 nm to 1.52 nm of $R_q$ surface roughness) with an ETC coating, according to some aspects of the disclosure.

FIG. 5 is a plot of water contact angle vs. reciprocating cycles of a Steel Wool Test, as conducted on the samples prepared according to this Example. The same data is also reported in tabular form in Table 2 below. FIG. 5 shows that the surface roughness of the outer $SiO_2$ surface beneath the ETC coating plays a substantial role in the durability of the ETC coating. As is evident from Table 2 and FIG. 5, the contact angle degrades below 100 degrees after 2000 cycles during the Steel Wool Test for samples having a surface roughness, $R_q$, of greater than 0.7 nm. Moreover, the degradation in contact angle below 100 degrees is observed after about 1000 cycles during the Steel Wool Test for the samples having a surface roughness, $R_q$, of greater than 0.7 nm. In addition, as is evident from FIG. 5, the samples having a surface roughness, $R_q$, of about 1 nm are observed with a contact angle of about 110 degrees after 50 cycles during the Steel Wool Test and above 95 degrees after 500 cycles during the Steel Wool Test.

TABLE 2

| Thickness (nm) | $R_q$ (nm) | No Steel Wool (SW) cycles | 50 SW cycles | 100 SW cycles | 200 SW cycles | 500 SW cycles | 1000 SW cycles | 2000 SW cycles |
|---|---|---|---|---|---|---|---|---|
| 18.5 | 0.329 | 116.3 | 115.9 | 114.0 | 113.7 | 113.0 | 112.2 | 105.5 |
| 33.7 | 0.43 | 116.6 | 116.0 | 115.1 | 113.2 | 112.8 | 112.3 | 111.9 |
| 64.4 | 0.657 | 115.6 | 114.9 | 113.8 | 113.8 | 113.1 | 110.7 | 109.3 |
| 95.2 | 0.707 | 115.1 | 113.1 | 112.4 | 110.9 | 109.0 | 87.3 | 82.3 |
| 155.8 | 1.02 | 100.4 | 110.6 | 106.0 | 105.2 | 97.6 | 80.3 | 75.5 |
| 368.9 | 1.52 | 115.4 | 108.8 | 150.8 | 96.5 | 94.9 | 85.0 | 80.1 |

Example 5

Figure 6:
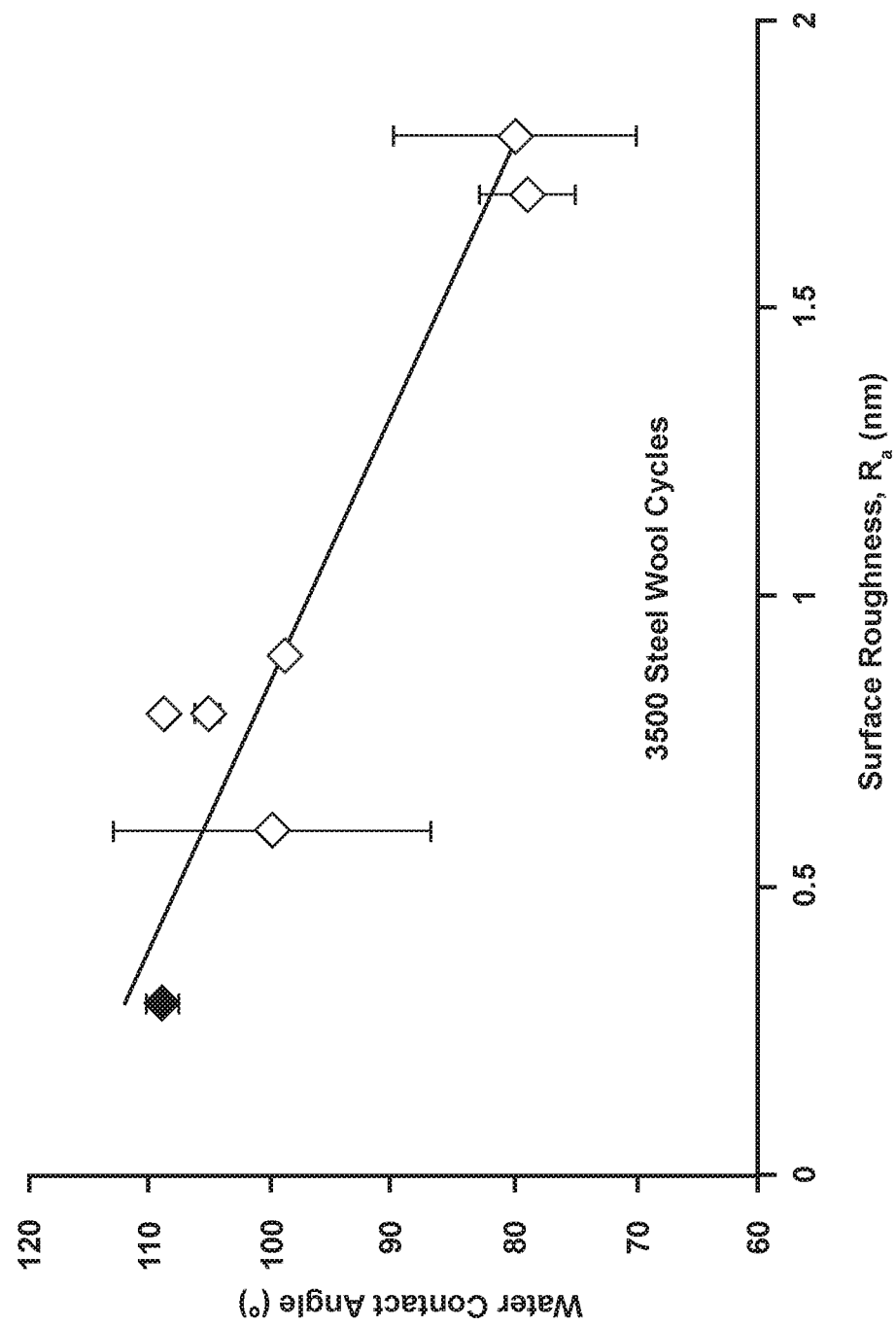
FIG. 6 is a plot of water contact angle vs. surface roughness of an outer film surface on inventive samples of Corning® Code 5318 glass having a silica film or an $AlO_xN_y$ film with an ETC coating deposited thereon, as measured after 3500 reciprocating cycles of a Steel Wool Test, according to some aspects of the disclosure.

FIG. 6 is a plot of water contact angle vs. surface roughness of an outer surface of inventive samples of Corning® Code 5318 glass having a silica film or a silica film and an $AlO_xN_y$ optical and/or scratch-film structure, all with an ETC coating deposited thereon (i.e., a Ceko Co., Ltd. ETC coating applied with a physical vapor deposition technique). Those samples comprising a glass substrate, silica film and an ETC coating are characterized by a surface roughness ($R_a$) of 0.3 nm (i.e., as shown in FIG. 6 with a solid diamond symbol). The remaining samples comprising a glass substrate, silica film, $AlO_xN_y$ optical and/or scratch-film structure and an ETC coating are characterized by a surface roughness ($R_a$) of about 0.6 nm to about 1.8 nm (i.e., as shown in FIG. 6 with an open diamond symbol). The contact angle results in FIG. 6 were obtained after subjecting the samples to 3500 cycles during the Steel Wool Test. Further, the samples with the $AlO_xN_y$ optical and/or scratch resistant-film structure were obtained by sputtering the AlON-type material directly onto 5318 glass substrates. As is evident from the data shown in FIG. 6, the contact angle correlates with the surface roughness of the outer surface of the film beneath the ETC coating (i.e., the outer surface of the silica film of the samples denoted by an open diamond symbol and the outer surface of the $AlO_xN_y$ optical and/or scratch-film structure of the samples denoted by a solid diamond symbol). In particular, those samples with a surface roughness, $R_a$, of greater than 1 nm exhibited a contact of angle of less than 100 degrees after the 3500 cycles during the Steel Wool Test. In contrast, those samples with a surface roughness, $R_a$, of less than 1 nm exhibited a contact angle of 100 degrees or greater after the 3500 cycles during the Steel Wool Test. Further, those skilled in the field of the disclosure will recognize that $R_a$ and $R_q$, the arithmetic average of absolute values and root mean squared (RMS) surface roughness, respectively, are strongly correlated, with $R_q$ often slightly higher than $R_a$ for the same surface. Accordingly, those with ordinary skill in the art can scale the Ra values shown in FIG. 6 to reflect $R_q$ values, all of which will be slightly larger and demonstrate the same trend observed in the $R_a$ values currently reported in FIG. 6.

Figure 7A:
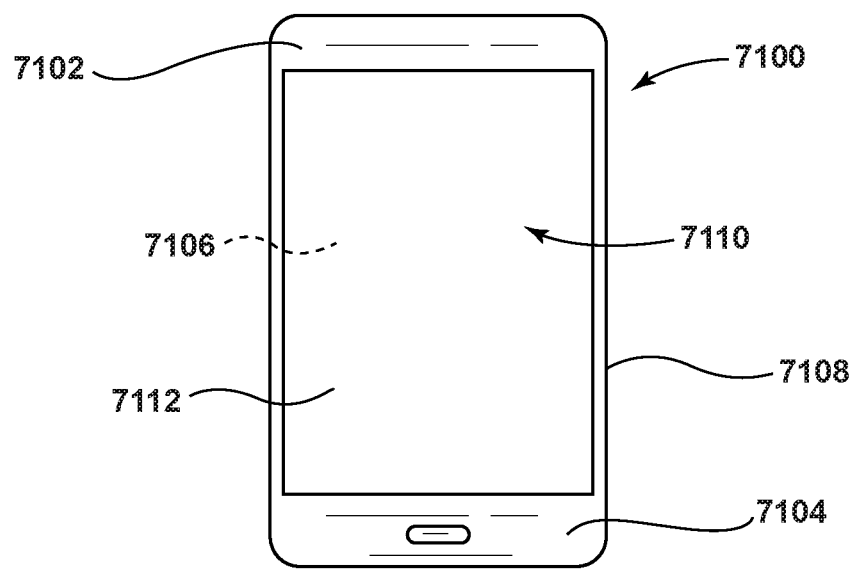
FIG. 7A is a plan view of an exemplary electronic device incorporating any of the glass articles disclosed herein.
Figure 7B:
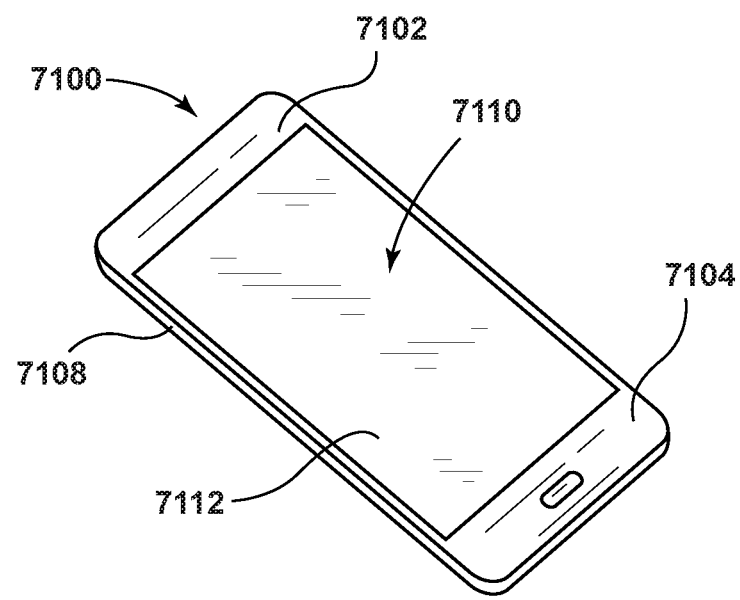
FIG. 7B is a perspective view of the exemplary electronic device of FIG. 7A.

The articles disclosed herein may be incorporated into a device article such as a device article with a display (or display device articles) (e.g., consumer electronics, including mobile phones, tablets, computers, navigation systems, wearable devices (e.g., watches) and the like), architectural device articles, transportation device articles (e.g., automotive, trains, aircraft, sea craft, etc.), appliance device articles, or any device article that benefits from some transparency, scratch-resistance, abrasion resistance or a combination thereof. An exemplary device article incorporating any of the articles disclosed herein is shown in FIGS. 7A and 7B. Specifically, FIGS. 7A and 7B show a consumer electronic device 7100 including a housing 7102 having front 7104, back 7106, and side surfaces 7108; electrical components (not shown) that are at least partially inside or entirely within the housing and including at least a controller, a memory, and a display 7110 at or adjacent to the front surface of the housing; and a cover substrate 7112 at or over the front surface of the housing such that it is over the display. In some embodiments, the cover substrate 7112 may include any of the articles disclosed herein. In some embodiments, at least one of a portion of the housing or the cover glass comprises the articles disclosed herein.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. An article, comprising:
   a glass, glass-ceramic or ceramic substrate comprising a primary surface;
   at least one of an optical film and a scratch-resistant film disposed over the primary surface; and
   an easy-to-clean (ETC) coating comprising a fluorinated material that is disposed over an outer surface of the at least one of an optical film and a scratch-resistant film,
   wherein the at least one of an optical film and a scratch-resistant film comprises an average hardness of 12 GPa or more,
   wherein the outer surface of the at least one of an optical film and a scratch-resistant film comprises a surface roughness ($R_q$) of less than 1.0 nm, and
   further wherein the at least one of an optical film and a scratch-resistant film comprises a total thickness of about 500 nm or more.

2. The article according to claim 1, wherein the outer surface of the at least one of an optical film and a scratch-resistant film comprises a surface roughness ($R_q$) of less than 0.7 nm.

3. The article according to claim 1, wherein the outer surface of the at least one of an optical film and a scratch-resistant film comprises a surface roughness ($R_q$) of less than 0.5 nm.

4. The article according to claim 1, wherein an exposed surface of the ETC coating comprises an average contact angle with water of 100 degrees or more after being subjected to 2000 reciprocating cycles under a load of 1 kg according to a Steel Wool Test.

5. The article according to claim 1, wherein an exposed surface of the ETC coating comprises an average contact angle with water of 100 degrees or more after being subjected to 3500 reciprocating cycles under a load of 1 kg according to a Steel Wool Test.

6. The article according to claim 1, wherein the ETC coating comprises a perfluoropolyether (PFPE) silane.

7. The article according to claim 1, wherein the at least one of an optical film and a scratch-resistant film comprises a scratch-resistant film comprising an $AlO_xN_y$ material.

8. The article according to claim 7, wherein the at least one of an optical film and a scratch-resistant film is an optical film and a scratch-resistant film, the scratch-resistant film disposed over the optical film.

9. The article according to claim 8, wherein the substrate comprises a glass composition and a compressive stress region, the compressive stress region extending from the primary surface to a first selected depth in the substrate.

10. The article according to claim 1, wherein the at least one of an optical film and a scratch-resistant film comprises a scratch-resistant film comprising a $Si_uAl_xO_yN_z$ material.

11. The article according to claim 1, wherein the at least one of an optical film and a scratch-resistant film comprises a total thickness of about 1500 nm or more.

12. A consumer electronic product, comprising:
    a housing having a front surface, a back surface and side surfaces;
    electrical components provided at least partially within the housing, the electrical components including at least a controller, a memory, and a display, the display being provided at or adjacent the front surface of the housing; and
    a cover glass disposed over the display,
    wherein at least one of a portion of the housing or the cover glass comprises the article of claim 1.

13. The article according to claim 1,
    wherein the at least one of an optical film and a scratch-resistant film is an optical film and a scratch-resistant film, the scratch-resistant film disposed over the optical film,
    wherein the outer surface of the at least one of an optical film and a scratch-resistant film comprises a surface roughness ($R_q$) of from about 0.1 nm to less than 1 nm,
    wherein the optical film comprises a plurality of alternating high index and low index layers with a first low index layer on the primary surface of the substrate, and further wherein each low index layer comprises $SiO_2$, fused $SiO_2$, fluorine-doped fused $SiO_2$, $MgF_2$, $CaF_2$, $AlF_3$, $YF_3$ or $YbF_3$ and each high index layer comprises $AlN$, $AlO_xN_y$, $SiO_xN_y$ or $Si_uAl_xO_yN_z$.

14. An article, comprising:
    a glass, glass-ceramic or ceramic substrate comprising a primary surface;
    at least one of an optical film and a scratch-resistant film disposed over the primary surface; and
    an easy-to-clean (ETC) coating comprising a fluorinated material that is disposed over an outer surface of the at least one of an optical film and a scratch-resistant film,
    wherein the at least one of an optical film and a scratch-resistant film comprises a total thickness of about 500 nm or more, and
    further wherein the outer surface of the at least one of an optical film and a scratch-resistant film comprises a surface roughness ($R_q$) of less than 1.0 nm.

15. The article according to claim 14, wherein the outer surface of the at least one of an optical film and a scratch-resistant film comprises a surface roughness ($R_q$) of less than 0.7 nm.

16. The article according to claim 14, wherein the outer surface of the at least one of an optical film and a scratch-resistant film comprises a surface roughness ($R_q$) of less than 0.5 nm.

17. The article according to claim 14, wherein an exposed surface of the ETC coating comprises an average contact angle with water of 100 degrees or more after being subjected to 2000 reciprocating cycles under a load of 1 kg according to a Steel Wool Test.

18. The article according to claim 14, wherein an exposed surface of the ETC coating comprises an average contact angle with water of 100 degrees or more after being subjected to 3500 reciprocating cycles under a load of 1 kg according to a Steel Wool Test.

19. The article according to claim 14, wherein the ETC coating comprises a perfluoropolyether (PFPE) silane.

20. The article according to claim 14, wherein the at least one of an optical film and a scratch-resistant film comprises a scratch-resistant film comprising an $AlO_xN_y$ material.

21. The article according to claim 20, wherein the at least one of an optical film and a scratch-resistant film is an optical film and a scratch-resistant film, the scratch-resistant film disposed over the optical film.

22. The article according to claim 21, wherein the substrate comprises a glass composition and a compressive stress region, the compressive stress region extending from the primary surface to a first selected depth in the substrate.

23. The article according to claim 14, wherein the at least one of an optical film and a scratch-resistant film comprises a scratch-resistant film comprising a $Si_uAl_xO_yN_z$ material.

24. The article according to claim 14, wherein the at least one of an optical film and a scratch-resistant film comprises a total thickness of about 1500 nm or more.

* * * * *